(12) United States Patent
Sasaki et al.

(10) Patent No.: US 7,676,912 B2
(45) Date of Patent: Mar. 16, 2010

(54) METHOD OF MANUFACTURING ELECTRONIC COMPONENT PACKAGE

(75) Inventors: Yoshitaka Sasaki, Milpitas, CA (US); Tatsushi Shimizu, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 218 days.

(21) Appl. No.: 11/896,709

(22) Filed: Sep. 5, 2007

(65) Prior Publication Data
US 2009/0056121 A1   Mar. 5, 2009

(51) Int. Cl.
*H05K 3/36* (2006.01)

(52) U.S. Cl. .......................... 29/830; 29/825; 438/106; 438/109

(58) Field of Classification Search .................. 29/825, 29/830; 438/106, 109
See application file for complete search history.

(56) References Cited

U.S. PATENT DOCUMENTS

| 5,926,380 | A | 7/1999 | Kim |
| 6,472,746 | B2 * | 10/2002 | Taniguchi et al. ............ 257/723 |
| 7,408,253 | B2 * | 8/2008 | Lin ............................... 257/686 |
| 2002/0017719 | A1 * | 2/2002 | Taniguchi et al. ............ 257/723 |
| 2003/0146012 | A1 * | 8/2003 | Song et al. ................... 174/52.1 |
| 2006/0228830 | A1 * | 10/2006 | Lin ................................ 438/109 |

FOREIGN PATENT DOCUMENTS

| JP | 2001-035993 | 2/2001 |
| JP | 2001-244403 | 9/2001 |

OTHER PUBLICATIONS

Gann K., "Neo-Stacking Technology," Dec. 1999, HDI Magazine.
U.S. Appl. No. 11/706,367, filed Feb. 15, 2007, Sasaki et al.
U.S. Appl. No. 11/806,047, filed May 29, 2007, Sasaki et al.
U.S. Appl. No. 11/818,282, filed Jul. 23, 2007, Sasaki et al.

* cited by examiner

*Primary Examiner*—C. J Arbes
(74) *Attorney, Agent, or Firm*—Oliff & Berridge, PLC

(57) ABSTRACT

An electronic component package includes: a main body including a plurality of layer portions that are stacked and that have their respective side surfaces, the main body having a side surface including the side surfaces of the layer portions; and wiring disposed on the side surface of the main body. Each of the layer portions has at least one electronic component chip and a plurality of electrodes disposed on the side surface of the layer portion. A method of manufacturing the electronic component package includes the steps of: fabricating a main body aggregate including a plurality of pre-main-body portions each of which is to become the main body later, the pre-main-body portions being arranged in one direction orthogonal to the direction of stacking of the plurality of layer portions; forming the wiring for each of the pre-main-body portions of the main body aggregate; and cutting the main body aggregate after the formation of the wiring so as to separate the plurality of pre-main-body portions from each other so that each of them becomes the main body and a plurality of electronic component packages are thereby formed.

12 Claims, 27 Drawing Sheets

METHOD OF MANUFACTURING ELECTRONIC COMPONENT PACKAGE

BACKGROUND OF THE INVENTION

1. Field of the Invention

The present invention relates to a method of manufacturing an electronic component package including a plurality of layer portions.

2. Description of the Related Art

A reduction in weight and an improvement in performance have been desired for mobile apparatuses represented by cellular phones and notebook personal computers. Higher integration of electronic components used for mobile apparatuses have been sought, accordingly.

A system large-scale integrated circuit (LSI) and a multi-chip module have been known as highly integrated electronic components. The system LSI is a single integrated circuit (IC) in which functions of various electronic components are incorporated. The multi-chip module is a module made up of a plurality of chips integrated through the use of a wiring board, for example.

The system LSI has a benefit of enabling higher integration density and minimizing wiring. On the other hand, the multi-chip module has a benefit that it facilitates the implementation of a single module having desired functions by integrating a plurality of chips having different functions.

A description will now be given of a conventional method of manufacturing an electronic component package including at least one chip and a plurality of external connecting terminals, such as a system LSI or a multi-chip module. In a typical conventional method of manufacturing an electronic component package, at least one chip is mounted on a base such as a wiring board prepared for a single electronic component package, a terminal of the chip is connected to an external connecting terminal, and the connecting portion between the terminal of the chip and the external connecting terminal is sealed. The terminal of the chip and the external connecting terminal are connected to each other by wire bonding or flip-chip, for example. In the case where flip-chip is employed, the terminal of the chip and the external connecting terminal are connected to each other through wiring inside the wiring board. Wiring among chips in the multi-chip module is also performed by wire bonding or flip-chip, for example.

JP 2001-035993A discloses a multi-chip module in which a bonding pad connected to a chip is connected to a lead that is an external connecting terminal by wire bonding. JP 2001-035993A further discloses a technique of forming inter-chip wiring and the bonding pad through a wire-forming process. According to this publication, the wire-forming process includes a film forming step, a lithography step and an etching step, for example.

JP 2001-244403A discloses a technique wherein inter-chip wiring and pads for external connection of a multi-chip module are formed through a wafer process. According to this publication, the wafer process includes a series of steps of forming an insulating layer, forming via holes, embedding plug metals, flattening, forming films by sputtering, and forming a wiring pattern through photolithography techniques.

U.S. Pat. No. 5,926,380 discloses a method of manufacturing a chip-size semiconductor package as will now be described. In this method, first, a lead frame is bonded to the top surface of a wafer in which a plurality of semiconductor chips are formed, the semiconductor chips being aligned with chip partition lines and each having a plurality of pads on the surface thereof. Next, leads of the lead frame and the pads of the semiconductor chips are connected to each other by wire bonding. Next, the top surfaces of the leads closer to the base ends are exposed and the top and bottom surfaces of the wafer are molded. Next, conductive metallic plating is performed on the exposed top surfaces of the leads closer to the base ends. Next, the wafer and the lead frame are cut to complete the semiconductor packages.

In the typical conventional method of manufacturing an electronic component package, a series of steps, such as mounting of at least one chip on the base, connection of the terminals of the chip to external connecting terminals, and sealing of the connecting portions between the terminals of the chip and the external connecting terminals, are performed for each electronic component package. This typical method has a disadvantage that it is difficult to mass-produce electronic component packages at low costs in a short period of time.

The method of manufacturing a chip-size semiconductor package disclosed in U.S. Pat. No. 5,926,380 makes it possible to mass-produce chip-size semiconductor packages at low costs. In this method, however, to alter the specifications of semiconductor chips, it is required to start with design of a wafer including a plurality of semiconductor chips. Therefore, the method has a disadvantage that it is difficult to respond to alterations to the specifications flexibly and quickly. In addition, it is impossible to manufacture multi-chip modules through this method.

A method of manufacturing a layered electronic component package as described below is disclosed by Keith D. Gann, "Neo-Stacking Technology", HDI Magazine, December 1999. In this manufacturing method, first, a plurality of circuits each including one or more chips are formed on a single wafer to fabricate a structure called "Neo-wafer". Next, the Neo-wafer is diced so that the plurality of circuits are separated from each other to thereby form a plurality of structures each of which is called "Neo-die". Next, a plurality of Neo-dice are laminated into a stack, and a plurality of stacks are laminated to fabricate an aggregate of the stacks. Next, a plurality of buses are formed on two sides of each of the stacks that the aggregate includes. Next, the individual stacks are separated. Each of the individual stacks thus formed is an electronic component package.

The above-described manufacturing method enables mass production of layered electronic component packages capable of achieving higher integration. However, this method has a disadvantage that it requires a large number of steps including a series of steps of laminating a plurality of stacks each made up of a number of Neo-dice stacked to thereby fabricate the aggregate of the stacks, forming a plurality of buses for the stacks in the state of aggregate, and then separating the individual stacks. The method has another disadvantage that, since a plurality of buses are to be formed for the stacks in the state of aggregate that is formed by laminating a plurality of stacks, it is required to precisely align the plurality of stacks that the aggregate includes, but it is difficult to perform this alignment with high precision.

OBJECT AND SUMMARY OF THE INVENTION

It is an object of the present invention to provide a method of manufacturing an electronic component package that makes it possible to easily and precisely mass-produce layered electronic component packages that are capable of achieving higher integration.

An electronic component package manufactured through a method of manufacturing an electronic component package of the present invention has: a main body including a plurality of layer portions that are stacked and that have their respective side surfaces, the main body having a side surface including the side surfaces of the plurality of layer portions; and wiring disposed on the side surface of the main body. Each of the layer portions has at least one electronic component chip and a plurality of electrodes disposed on the side surface of the layer portion. The wiring is connected to the electrodes of the plurality of layer portions.

The method of manufacturing the electronic component package of the invention includes the steps of fabricating a main body aggregate including a plurality of pre-main-body portions each of which is to become the main body later, the pre-main-body portions being arranged in one direction that is orthogonal to the direction of stacking of the plurality of layer portions; forming the wiring for each of the pre-main-body portions of the main body aggregate; and cutting the main body aggregate after the formation of the wiring so as to separate the plurality of pre-main-body portions from each other so that each of them becomes the main body and a plurality of electronic component packages are thereby formed.

In the method of manufacturing the electronic component package of the invention, each of the layer portions may further have a base including a plurality of leads, each of the leads may have an end face disposed at the side surface of the layer portion to constitute one of the electrodes, and the at least one electronic component chip may be bonded to the base and electrically connected to at least one of the leads.

In the method of manufacturing the electronic component package of the invention, the step of fabricating the main body aggregate may include the steps of fabricating a plurality of substructures that respectively correspond to the plurality of layer portions of the electronic component package, each of the substructures being composed of a plurality of the same kind of layer portions arranged; cutting each of the plurality of substructures to fabricate a plurality of elements that will be stacked to constitute the main body aggregate later; and stacking the plurality of elements so as to form the main body aggregate. In this case, each of the layer portions may further have a base including a plurality of leads, each of the leads may have an end face disposed at the side surface of the layer portion to constitute one of the electrodes, and the at least one electronic component chip may be bonded to the base and electrically connected to at least one of the leads. In addition, the step of fabricating each of the substructures may include the steps of: fabricating a wafer including a plurality of pre-base portions that will be separated from each other later so that each of them will thereby become the base of one of the layer portions; and bonding the at least one electronic component chip to each of the pre-base portions of the wafer.

In the method of manufacturing the electronic component package of the invention, the step of fabricating the main body aggregate may include the steps of fabricating a plurality of substructures that respectively correspond to the plurality of layer portions of the electronic component package, each of the substructures being composed of a plurality of the same kind of layer portions arranged; fabricating a layered substructure including a portion to become the main body aggregate by stacking the plurality of substructures in correspondence with the order of stacking of the plurality of layer portions of the electronic component package; and cutting the layered substructure so as to form the main body aggregate. In this case, each of the layer portions may further have a base including a plurality of leads, each of the leads may have an end face disposed at the side surface of the layer portion to constitute one of the electrodes, and the at least one electronic component chip may be bonded to the base and electrically connected to at least one of the leads. In addition, the step of fabricating each of the substructures may include the steps of: fabricating a wafer including a plurality of pre-base portions that will be separated from each other later so that each of them will thereby become the base of one of the layer portions; and bonding the at least one electronic component chip to each of the pre-base portions of the wafer.

In the method of manufacturing the electronic component package of the invention, the main body may further include a cap layer located at one end in the direction of stacking of the plurality of layer portions. The cap layer may have a plurality of terminals, and the wiring may be connected to at least one of the terminals.

In the method of manufacturing the electronic component package of the invention, the wiring may be formed by plating.

In the method of manufacturing the electronic component package of the invention, in each of the layer portions, the at least one electronic component chip may be sealed.

In the method of manufacturing the electronic component package of the invention, in the step of forming the wiring, the wiring may be formed after polishing a surface of the main body aggregate on which the wiring is to be formed.

In the method of manufacturing the electronic component package of the invention, in the step of forming the wiring, a plurality of main body aggregates may be arranged in the direction of stacking of the plurality of layer portions and bonded to each other to fabricate a structure, the wiring may be formed for each of the pre-main-body portions of the plurality of main body aggregates included in the structure, and then the plurality of main body aggregates included in the structure may be separated from each other.

According to the method of manufacturing the electronic component package of the invention, it is possible to easily and precisely mass-produce layered electronic component packages capable of achieving higher integration.

Other and further objects, features and advantages of the invention will appear more fully from the following description.

DETAILED DESCRIPTION OF THE PREFERRED EMBODIMENT

Figure 1:
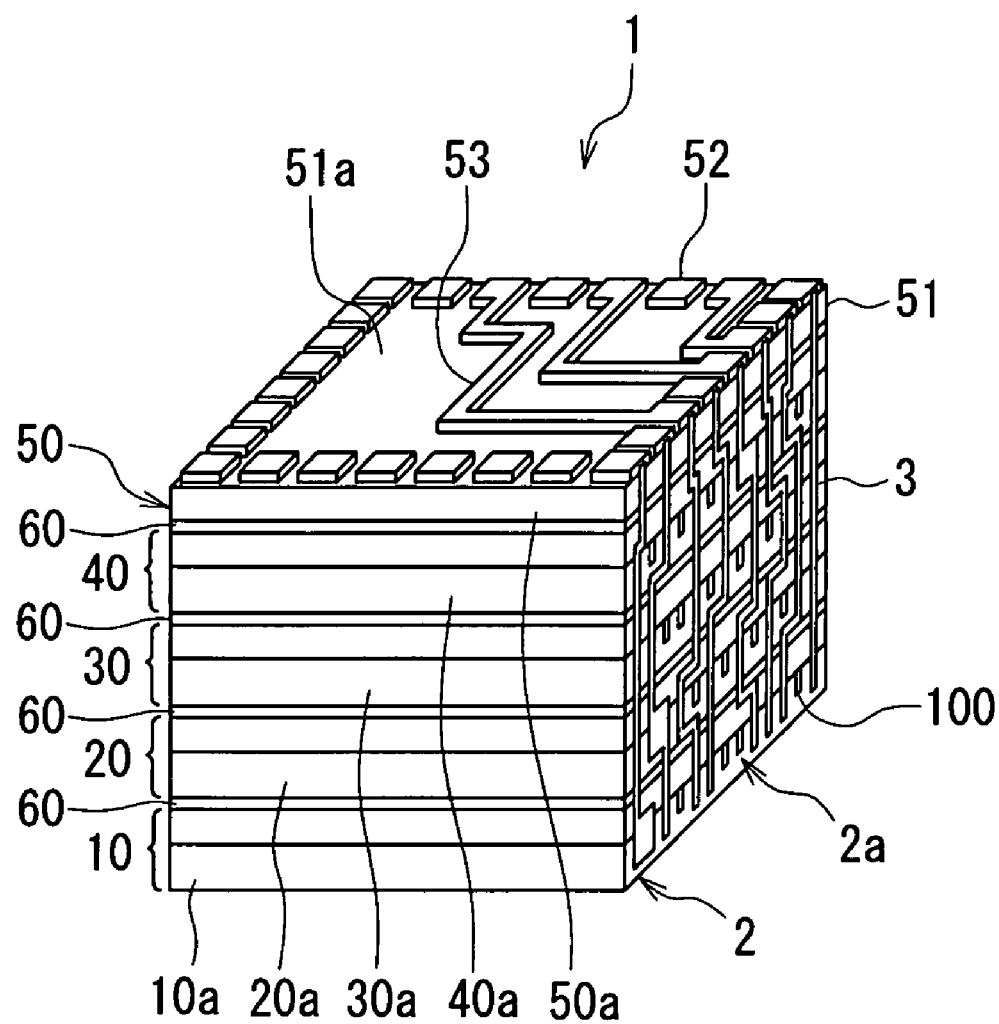
FIG. 1 is a perspective view of an electronic component package of an embodiment of the invention.

An embodiment of the present invention will now be described in detail with reference to the drawings. Reference is first made to FIG. 1 to describe the configuration of an electronic component package manufactured through a manufacturing method of the embodiment of the invention. FIG. 1 is a perspective view of the electronic component package. As illustrated in FIG. 1, the electronic component package 1 has a main body 2 including a plurality of layer portions stacked. FIG. 1 illustrates an example in which the main body 2 includes four layer portions 10, 20, 30 and 40 stacked in this order from the bottom. The main body 2 further includes a cap layer 50 disposed on the uppermost layer portion 40. An adhesive layer 60 formed of an adhesive is provided to establish bonding between every two of the layer portions adjacent to each other in the vertical direction and between the layer portion 40 and the cap layer 50. The adhesive used to form the adhesive layer 60 can be an inorganic adhesive or an organic adhesive. As the organic adhesive, it is preferred to use a synthetic adhesive, particularly a resin-base adhesive of various kinds, such as an acrylic adhesive, an epoxy adhesive, a polyimide adhesive, or a cyanoacrylate adhesive, which is an instant adhesive.

The plane geometry of each of the layer portions 10, 20, 30 and 40 and the cap layer 50 is rectangular. The layer portions 10, 20, 30 and 40 and the cap layer 50 each have four side surfaces 10a, 20a, 30a, 40a, and 50a, respectively. The main body 2 has four side surfaces 2a including the side surfaces 10a, 20a, 30a, 40a and 50a.

The electronic component package 1 further has wiring 3 disposed on at least one of the side surfaces 2a of the main body 2. The layer portions 10, 20, 30 and 40 each have at least one electronic component chip (hereinafter simply referred to as chip), and each have a plurality of electrodes 100 disposed on the respective side surfaces 10a, 20a, 30a and 40a of the layer portions 10, 20, 30 and 40. The wiring 3 is connected to the electrodes 100 of the plurality of layer portions.

Each of the layer portions further has a base including a plurality of leads. Each of the leads has an end face located at the side surface of the layer portion to constitute one of the electrodes 100. The at least one chip is bonded to the base and electrically connected to at least one of the leads.

The cap layer 50 has a plate-shaped substrate portion 51 whose plane geometry is rectangular, and a plurality of external connecting terminals 52 disposed on a top surface 51a of the substrate portion 51. The cap layer 50 may further have one or more conducting paths 53 disposed on the top surface 51a of the substrate portion 51 and electrically connecting two or more of the external connecting terminals 52 to each other.

In the electronic component package 1, the layer portions 10, 20, 30 and 40 respectively include circuits each of which includes the at least one chip. The circuits are connected to each other via the wiring 3.

The method of manufacturing the electronic component package 1 of the embodiment will now be summarized. The method of manufacturing the electronic component package 1 of the embodiment includes the steps of: fabricating a main body aggregate including a plurality of pre-main-body portions each of which is to become the main body 2 later, the pre-main-body portions being arranged in one direction that is orthogonal to the direction of stacking of the plurality of layer portions 10, 20, 30 and 40; forming the wiring 3 for each of the pre-main-body portions of the main body aggregate; and cutting the main body aggregate after the formation of the wiring 3 so as to separate the plurality of pre-main-body portions from each other so that each of them becomes the main body 2 and a plurality of electronic component packages 1 are thereby formed.

The step of fabricating the main body aggregate starts with fabrication of a plurality of substructures that respectively correspond to the plurality of layer portions 10, 20, 30 and 40 of the electronic component package 1, each of the substructures being composed of a plurality of the same kind of layer portions arranged. The step of fabricating each of the substructures will now be described with reference to FIG. 2 to FIG. 5.

Figure 2:
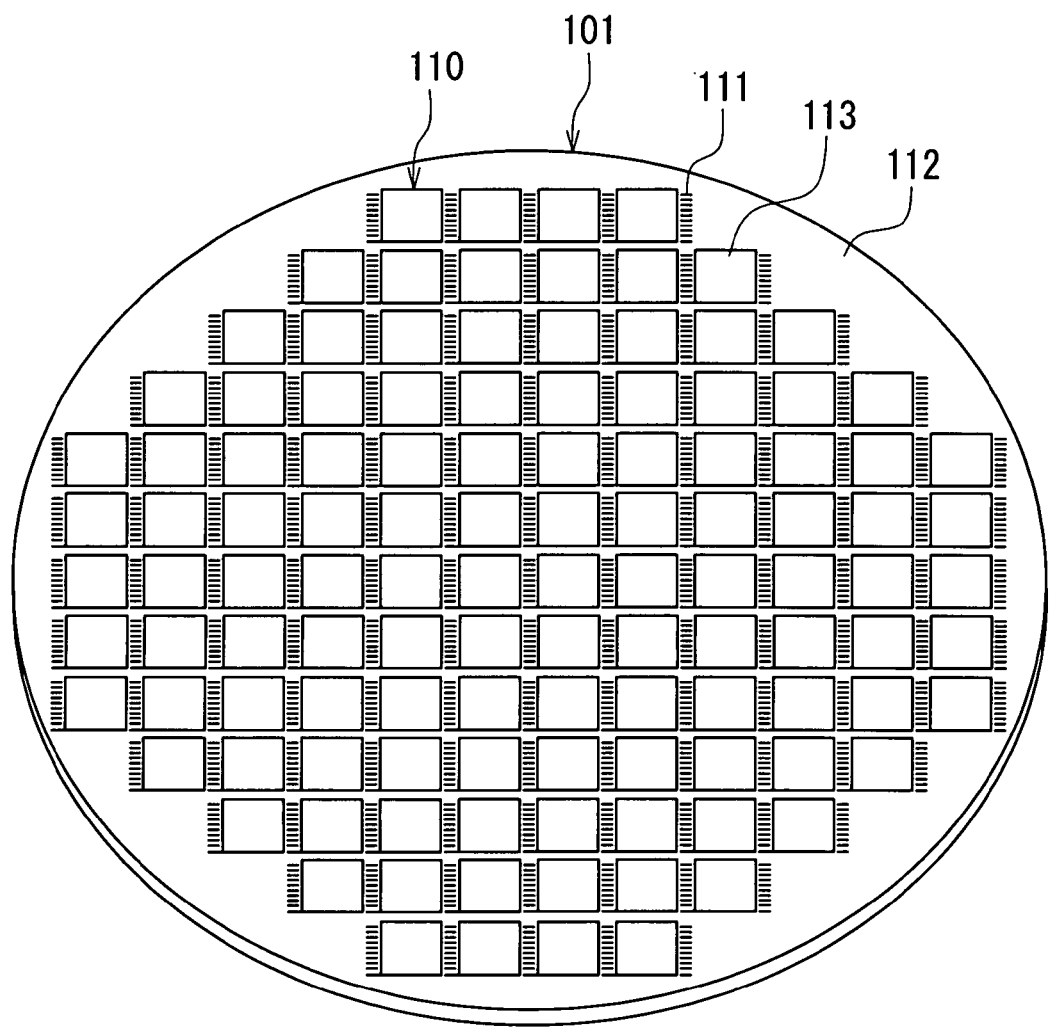
FIG. 2 is an explanatory view illustrating a wafer for layer portion of the embodiment of the invention.

In the step of fabricating each substructure, first, a wafer for layer portion (hereinafter simply referred to as wafer) 101 illustrated in FIG. 2 is fabricated. The wafer 101 has a plurality of sets of leads 111, and a wafer main body 112 for retaining the plurality of sets of leads 111. One set of leads 111 corresponds to one layer portion. The wafer 101 does not include any circuit element. The wafer 101 includes a plurality of pre-base portions 110 that will be separated from each other later so that each of them will thereby become a base of one of the layer portions.

The pre-base portions 110 are arranged such that a plurality of ones of the pre-base portions 110 are aligned in each of the vertical and horizontal directions. In the example illustrated in FIG. 2, in each of the pre-base portions 110, a plurality of leads 111 are disposed on both sides opposed to each other in the horizontal direction. In the example illustrated in FIG. 2, at the boundary between two of the pre-base portions 110 adjacent to each other along the horizontal direction, among a plurality of leads 111 of the adjacent two of the pre-base portions 110, the ones closer to the boundary are coupled to each other. FIG. 2 illustrates that the wafer 101 is in the form of a circular plate, by way of example. The wafer 101 may be in any form, however, such as the form of a plate having rectangular top and bottom surfaces.

The wafer 101 illustrated in FIG. 2 further has a plurality of chip bonding conductor layers 113 to each of which at least one chip is to be bonded. In the example illustrated in FIG. 2, one chip bonding conductor layer 113 is allocated to each pre-base portion 110. A plurality of leads 111 are disposed on both sides of the chip bonding conductor layer 113, the sides being opposed to each other in the horizontal direction. However, it is not necessarily required that the wafer 101 have the chip bonding conductor layers 113.

Figure 3:
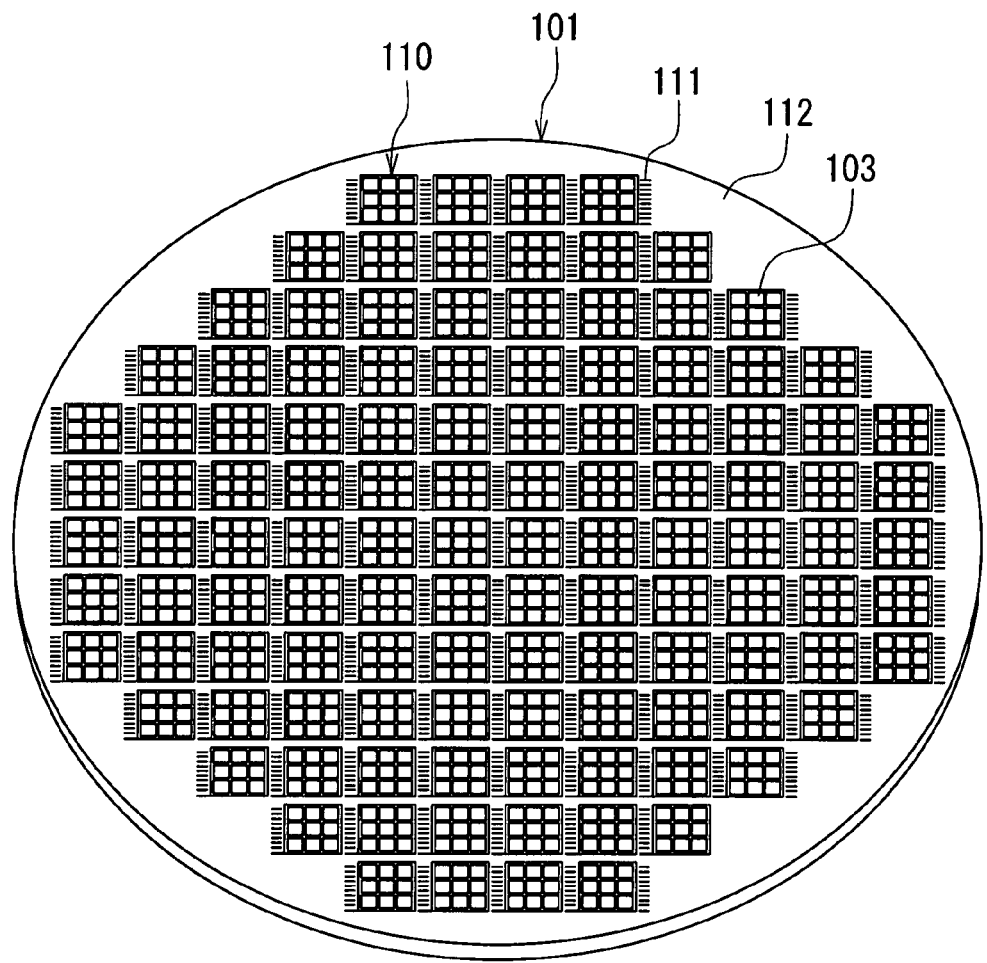
FIG. 3 is an explanatory view illustrating a step of a method of manufacturing an electronic component package of the embodiment of the invention.

In the step of fabricating the substructure, next, as illustrated in FIG. 3, the at least one chip 103 to be included in each layer portion is bonded to each of the chip bonding conductor layers 113 of the wafer 101. FIG. 3 illustrates an example in which the number of the chips 103 included in each layer portion is nine. However, any number of chips 103 can be included in each layer portion. Although not illustrated in FIG. 3, each of the chips 103 has a plurality of electrodes. The chips 103 may be semiconductor integrated circuit elements or other circuit elements, or may be sensors or actuators formed by using the micro-electro mechanical systems (MEMS), for example. The chips 103 are electrically connected to at least one of the leads 111.

Figure 4:
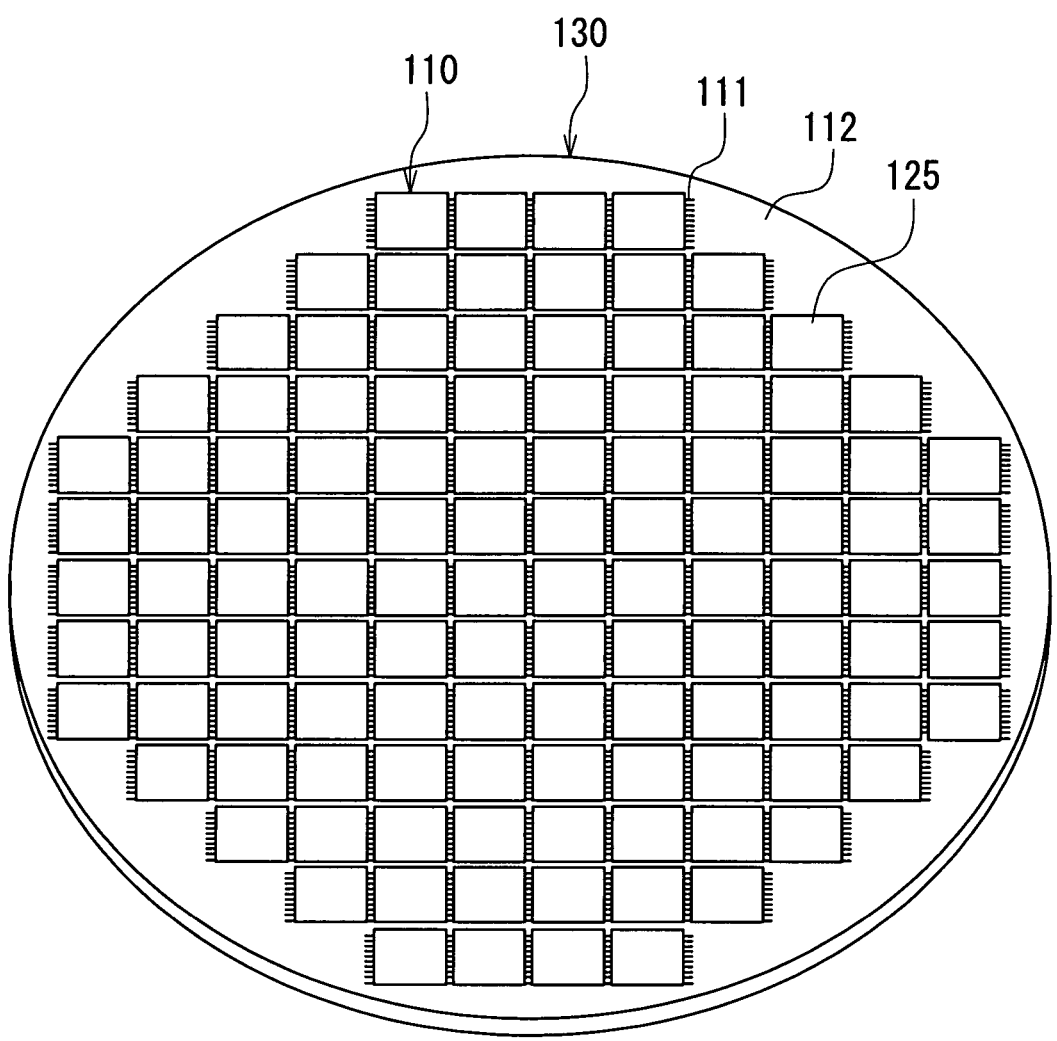
FIG. 4 is an explanatory view illustrating a step that follows the step of FIG. 3.

In the step of fabricating the substructure, next, as illustrated in FIG. 4, sealers 125 for sealing the chips 103 may be formed. FIG. 4 illustrates an example in which individual sealers 125 are formed for the respective pre-base portions 110. However, a single sealer 125 may be formed for sealing all the chips 103 of all the pre-base portions 110. The sealer(s) 125 may be dispensed with, however.

In this way, a single substructure 130 composed of a plurality of the same kind of layer portions arranged is fabricated. A plurality of kinds of substructures 130 are thus fabricated to respectively correspond to the plurality of layer portions 10, 20, 30 and 40 of the electronic component package 1.

Figure 5:
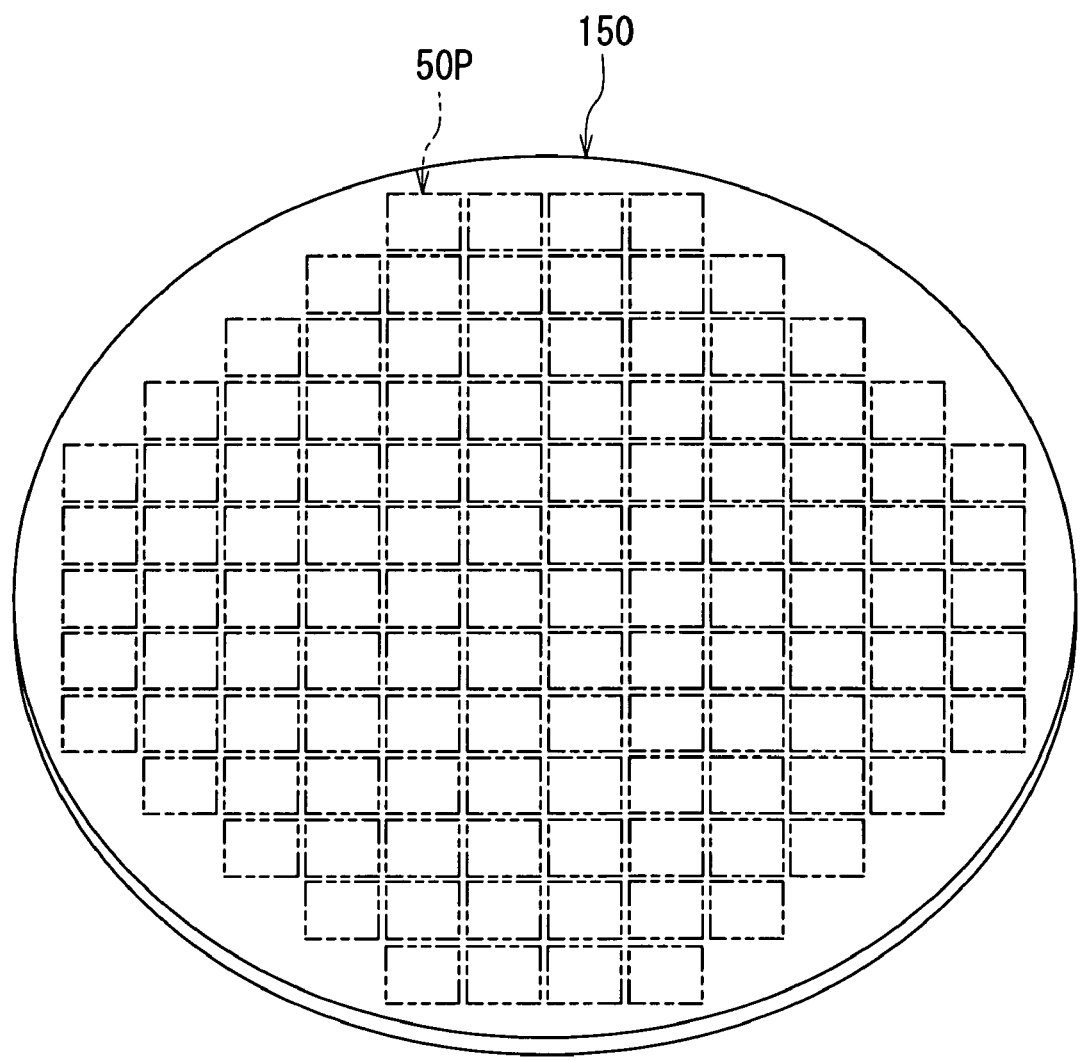
FIG. 5 is an explanatory view illustrating a wafer for cap layer used in the method of manufacturing the electronic component package of the embodiment of the invention.

In the step of fabricating the main body aggregate, as illustrated in FIG. 5, a wafer 150 for cap layer is also fabricated. The wafer 150 for cap layer is composed of a plurality of portions 50P arranged, each of the portions 50P being intended to become the cap layer 50. While each of the portions 50P of the wafer 150 includes a plurality of external connecting terminals 52 and one or more conducting paths 53, illustrations thereof are omitted in FIG. 5.

In the step of fabricating the main body aggregate, next, the main body aggregate is fabricated using the wafer 150 for cap layer and the plurality of substructures 130 that respectively correspond to the plurality of layer portions 10, 20, 30 and 40 of the electronic component package 1. Examples of the method of fabricating the main body aggregate using the wafer 150 and the plurality of substructures 130 include a first method and a second method described below.

Figure 6:
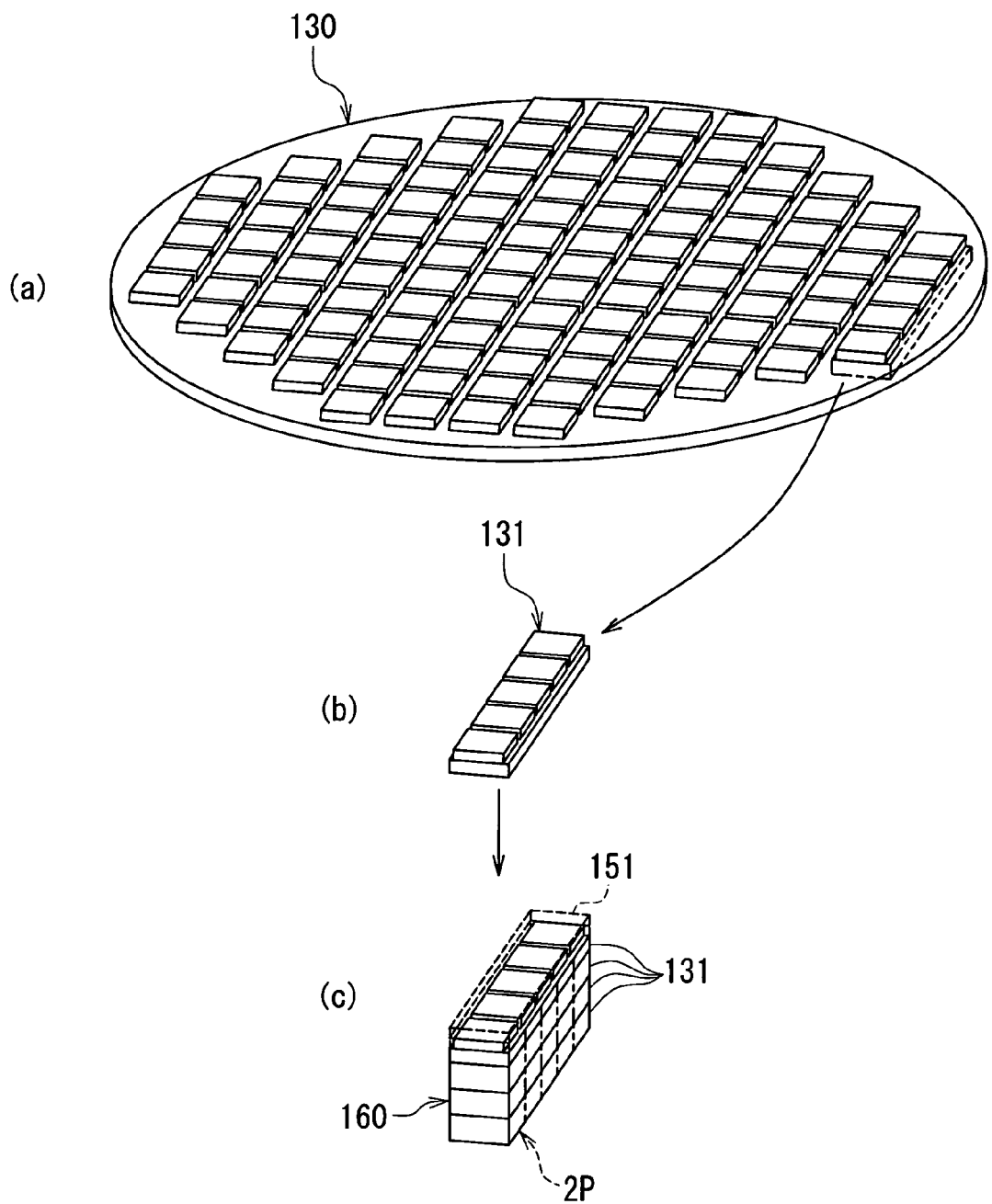
FIG. 6 is an explanatory view illustrating a first method of fabricating a main body aggregate in the embodiment of the invention.

The first method will now be described with reference to FIG. 6. In FIG. 6, portion (a) illustrates one substructure 130. It is assumed here that this substructure 130 corresponds to the layer portion 10. In the first method, the substructure 130 is cut to form an element 131 as illustrated in portion (b) of FIG. 6. This element 131 is composed of a plurality of portions each of which is to become the layer portion 10, the plurality of portions being arranged in one direction. In the same way, a plurality of substructures 130 respectively corresponding to the layer portions 20, 30 and 40 are each cut to form a plurality of elements 131 respectively corresponding to the layer portions 20, 30 and 40. The wafer 150 for cap layer is also cut to form an element 151 composed of a plurality of portions each of which is to become the cap layer 50, the plurality of portions being arranged in one direction.

In the first method, next, as illustrated in portion (c) of FIG. 6, the plurality of elements 131 respectively corresponding to the layer portions 10, 20, 30 and 40, and the element 151 are stacked in this order from the bottom to thereby fabricate the main body aggregate 160. Every two of the elements adjacent to each other in the vertical direction are bonded to each other with an adhesive. The main body aggregate 160 fabricated by the first method has the plurality of elements 131 respectively corresponding to the layer portions 10, 20, 30 and 40, and the element 151. Furthermore, the main body aggregate 160 includes a plurality of pre-main-body portions 2P each of which is to become the main body 2 later, the plurality of pre-main-body portions 2P being arranged in one direction that is orthogonal to the direction of stacking of the plurality of layer portions 10, 20, 30 and 40.

Figure 7:
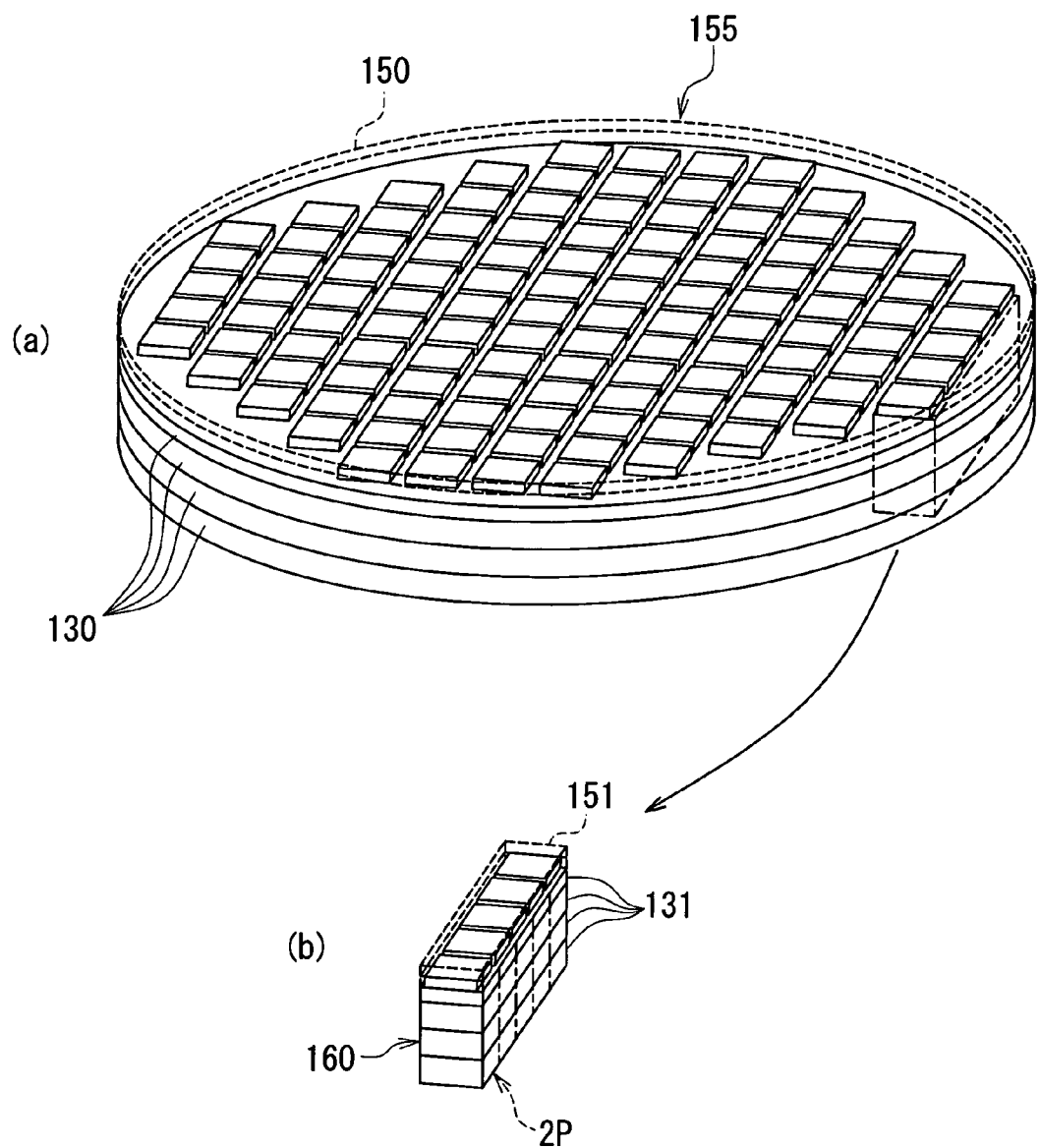
FIG. 7 is an explanatory view illustrating a second method of fabricating the main body aggregate in the embodiment of the invention.

The second method will now be described with reference to FIG. 7. In the second method, as illustrated in portion (a) of FIG. 7, a plurality of substructures 130 that respectively correspond to the layer portions 10, 20, and 40, and the wafer 150 for cap layer are stacked in this order from the bottom to thereby fabricate a layered substructure 155 including portions to become a plurality of main body aggregates. In the second method, next, as illustrated in portion (b) of FIG. 7, the layered substructure 155 is cut so as to form the main body aggregate 160. The main body aggregate 160 formed by the second method has a plurality of elements 131 respectively corresponding to the layer portions 10, 20, 30 and 40, and the element 151, as does the main body aggregate 160 fabricated by the first method. Furthermore, the main body aggregate 160 includes a plurality of pre-main-body portions 2P each of which is to become the main body 2 later, the plurality of pre-main-body portions 2P being arranged in one direction that is orthogonal to the direction of stacking of the plurality of layer portions 10, 20, 30 and 40.

In the method of manufacturing the electronic component package 1, after the main body aggregate 160 is fabricated by the first or the second method, the following steps are performed: forming the wiring 3 for each of the pre-main-body portions 2P of the main body aggregate 160; and cutting the main body aggregate 160 after the formation of the wiring 3 so as to separate the plurality of pre-main-body portions 2P from each other so that each of them becomes the main body 2 and a plurality of electronic component packages 1 are thereby formed. These steps will be described in detail later.

Reference is now made to FIG. 8 to FIG. 19 to describe a first example of the method of fabricating each substructure 130 in detail. In cross-sectional views of FIG. 13 to FIG. 19, to show respective portions clearly, the portions are drawn on a scale different from the scale on which the corresponding portions of the top views of FIG. 8 to FIG. 12 are drawn.

The first example of the method of fabricating each substructure 130 starts with fabrication of the wafer 101. The step of fabricating the wafer 101 will now be described with reference to FIG. 8, FIG. 9, FIG. 13 and FIG. 14.

Figure 8:
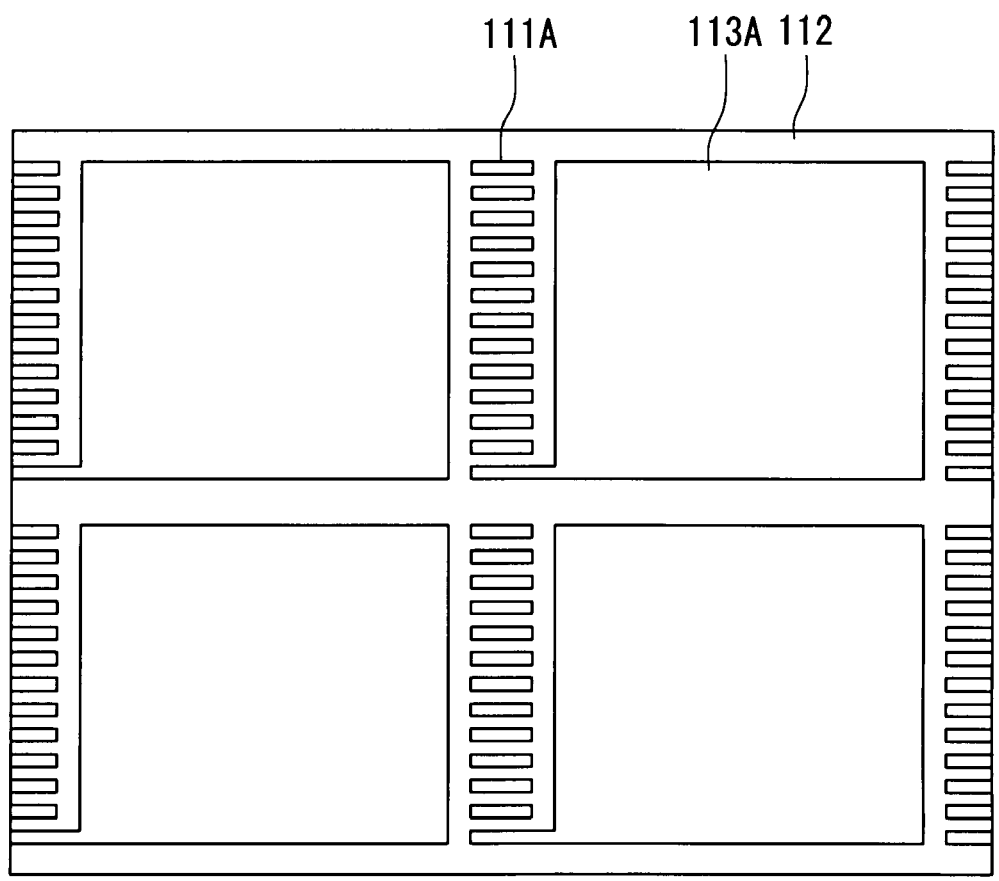
FIG. 8 is a top view illustrating part of a stack of layers fabricated in a step of a first example of a method of fabricating a substructure in the embodiment of the invention.
Figure 13:
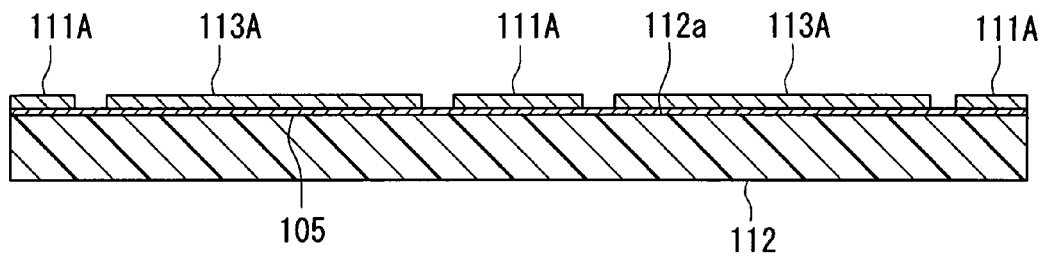
FIG. 13 is a cross-sectional view illustrating part of a stack of layers fabricated in a step of the first example of the method of fabricating the substructure in the embodiment of the invention.

FIG. 8 and FIG. 13 illustrate a step of the process of fabricating the wafer 101. FIG. 8 is a top view illustrating part of a stack of layers fabricated in this step. FIG. 13 is a cross-sectional view illustrating part of the stack of layers fabricated in this step. In this step, first, the wafer main body 112 is fabricated. As illustrated in FIG. 13, the wafer main body 112 is in the form of a plate having a flat top surface 112a. At least a portion of the wafer main body 112 including the top surface 112a is formed of an insulating material or a high-resistance material. The wafer main body 112 can be formed of a resin, a ceramic or glass, for example. The wafer main body 112 may also be formed of glass fibers solidified with a resin. The wafer main body 112 may also be formed of a structure in which an insulating film is formed on one of surfaces of a plate of a semiconductor material such as silicon.

Next, a seed layer 105 for plating is formed by sputtering, for example, to entirely cover the top surface 112a of the wafer main body 112. The seed layer 105 has a thickness within a range of 50 to 200 nm, for example. The seed layer 105 can be made of Cu, Ni, Cr, Fe or Au, for example.

Next, on the seed layer 105, formed are a plurality of first plating layers 111A that are to become portions of the leads 111, and a plurality of chip bonding plating layers 113A that are to constitute the plurality of chip bonding conductor layers 113. Each of the first plating layers 111A and the chip bonding plating layers 113A has a thickness within a range of 5 to 10 µm, for example.

Figure 9:
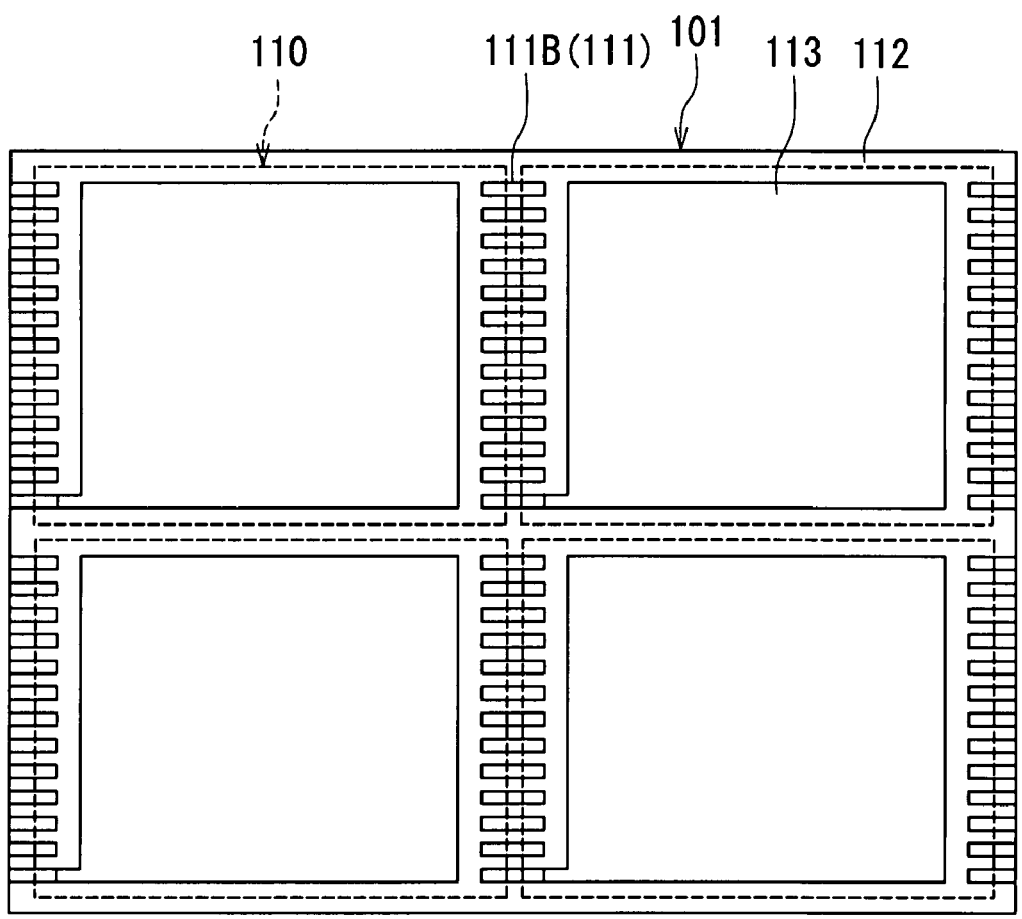
FIG. 9 is a top view illustrating part of a stack of layers obtained in a step that follows the step of FIG. 8.
Figure 14:
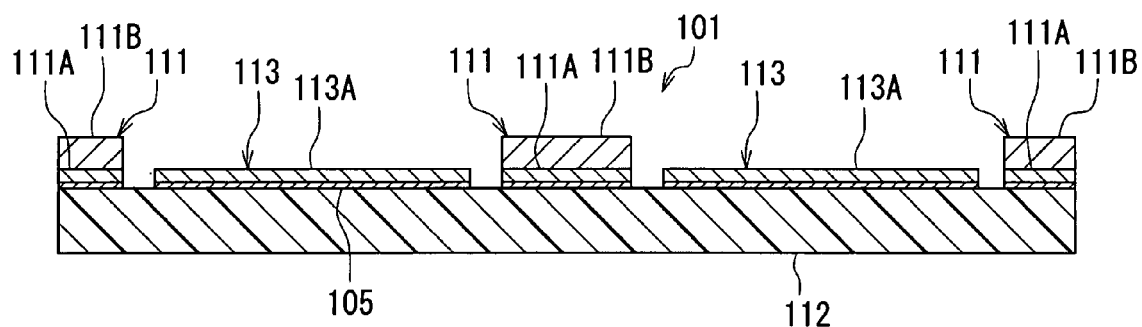
FIG. 14 is a cross-sectional view illustrating part of a stack of layers obtained in a step that follows the step of FIG. 13.

FIG. 9 and FIG. 14 illustrate the next step. FIG. 9 is a top view illustrating part of a stack of layers fabricated in this step. FIG. 14 is a cross-sectional view illustrating part of the stack of layers fabricated in this step. In this step, first, a plurality of second plating layers 111B are formed by plating such as frame plating such that the second plating layers 111B are respectively disposed on the first plating layers 111A. Each of the second plating layers 111B has a thickness within a range of 30 to 500 µm, for example. The plating layers 111A, 111B and 113A can be made of any of Cu, Ni, Fe, Ru and Cr, or an alloy containing any of these, or NiFe or CoNiFe, for example.

Next, the seed layer 105 except portions thereof located below the plating layers 111A and 113A is removed by etching using the chip bonding plating layers 113A and layered films made up of the plating layers 111A and 111B as masks. As a result, the leads 111 are formed of the plating layers 111A and 111B and portions of the seed layer 105 remaining below the plating layers 111A. In addition, the chip bonding conductor layers 113 are formed of the chip bonding plating layers 113A and portions of the seed layer 105 remaining therebelow. The wafer 101 is thus fabricated.

The thickness of each lead 111 is greater than the thickness of each chip bonding conductor layer 113 by the thickness of each second plating layer 111B. A difference in level is formed between the top surface of each lead 111 and the top surface of each chip bonding conductor layer 113 so that the top surface of each lead 111 is located higher than the top surface of each chip bonding conductor layer 113. This difference in level is preferably equal to or nearly equal to the thickness of the chips 103 that will be disposed on the chip bonding conductor layers 113 later. In a case where the chips 103 are fabricated by using a semiconductor wafer having a diameter of 200 or 300 mm, for example, the thickness of the chips 103 may be nearly equal to the thickness of the semiconductor wafer. In a case where the chips 103 are fabricated by using a semiconductor wafer, the thickness of the chips 103 may be reduced by polishing and thereby thinning the semiconductor wafer. In the case where the chips 103 are fabricated by using a semiconductor wafer, the thickness of the chips 103 is within a range of 30 to 800 µm, for example, but may be greater than 800 µm. It is preferred that the thickness of the chips 103 be within a range of 30 to 250 µm.

Although it is not necessarily required to provide the chip bonding conductor layers 113, it is preferred to provide them because of the following reason. First, if the chip bonding conductor layers 113 are not provided, the chips 103 are to be directly bonded to the wafer main body 112 made of a resin or a ceramic, for example. In this case, it is impossible to bond the chips 103 to the wafer main body 112 through the use of solder. In contrast, if the chip bonding conductor layers 113 are provided, it is easy to bond the chips 103 to the chip bonding conductor layers 113 through the use of solder. Furthermore, if the chip bonding conductor layers 113 are provided, it is possible to connect the chips 103 to the ground by using the chip bonding conductor layers 113 as the ground. It is thereby possible to achieve advantages such as a reduction in noise generated in the chips 103.

How to fabricate the wafer 101 is not limited to the above-described method. For example, the wafer 101 may be fabricated by the following method. In this method, first, a conductor layer that will be partially etched later to thereby become the plurality of sets of leads 111 is formed on the top surface 112a of the wafer main body 112. This conductor layer can be formed by bonding a rolled metal foil to the top surface 112a of the wafer main body 112. In this case, the material of the conductor layer can be Al, Cu, Ni or Ag, for example.

Alternatively, the conductor layer can be formed by, for example, forming a seed layer for plating on the top surface 112a of the wafer main body 112 by sputtering, and then forming a plating layer on the seed layer by plating. The seed layer can be made of Cu, Ni, Cr, Fe or Au, for example. The plating layer can be made of any of Cu, Ni, Fe, Ru and Cr, or an alloy containing any of these, or NiFe or CoNiFe, for example.

Next, an etching mask that is not shown is formed on the conductor layer. This etching mask covers a portion of the conductor layer to become the leads 111. The etching mask can be formed by, for example, patterning a photoresist layer by photolithography. Next, the conductor layer is partially etched by wet etching, for example. The plurality of sets of leads 111 are formed of portions of the conductor layer remaining after this etching.

The wafer 101 may also be fabricated by bonding a lead frame including the plurality of sets of leads 111 and the plurality of chip bonding conductor layers 113 onto the top surface 112a of the wafer main body 112. In this case, the lead frame is fabricated through a typical fabrication method. For example, the lead frame may be fabricated by stamping a sheet metal through the use of a die, or may be fabricated by patterning a sheet metal by etching.

The wafer 101 may also be fabricated by forming the plurality of sets of leads 111 and the plurality of chip bonding conductor layers 113 on the top surface 112a of the wafer main body 112 by sputtering. In this case, the leads 111 and the chip bonding conductor layers 113 can be made of any of Mo, Cr, W, Pt, Pa and Ru or an alloy containing any of these.

The wafer 101 may also be fabricated by the following method. In this method, first, a plate made of ceramic is processed to fabricate the wafer main body 112 having grooves in which the plurality of sets of leads 111 and the plurality of chip bonding conductor layers 113 are to be placed. Next, the grooves of the wafer main body 112 are filled with a conductive material to thereby form the plurality of sets of leads 111 and the plurality of chip bonding conductor layers 113. A method for filling the grooves with a conductive material can be melting a metal and pouring it into the grooves, that is, casting. The metal to be used in this case is preferably one that melts at low temperatures.

Figure 10:
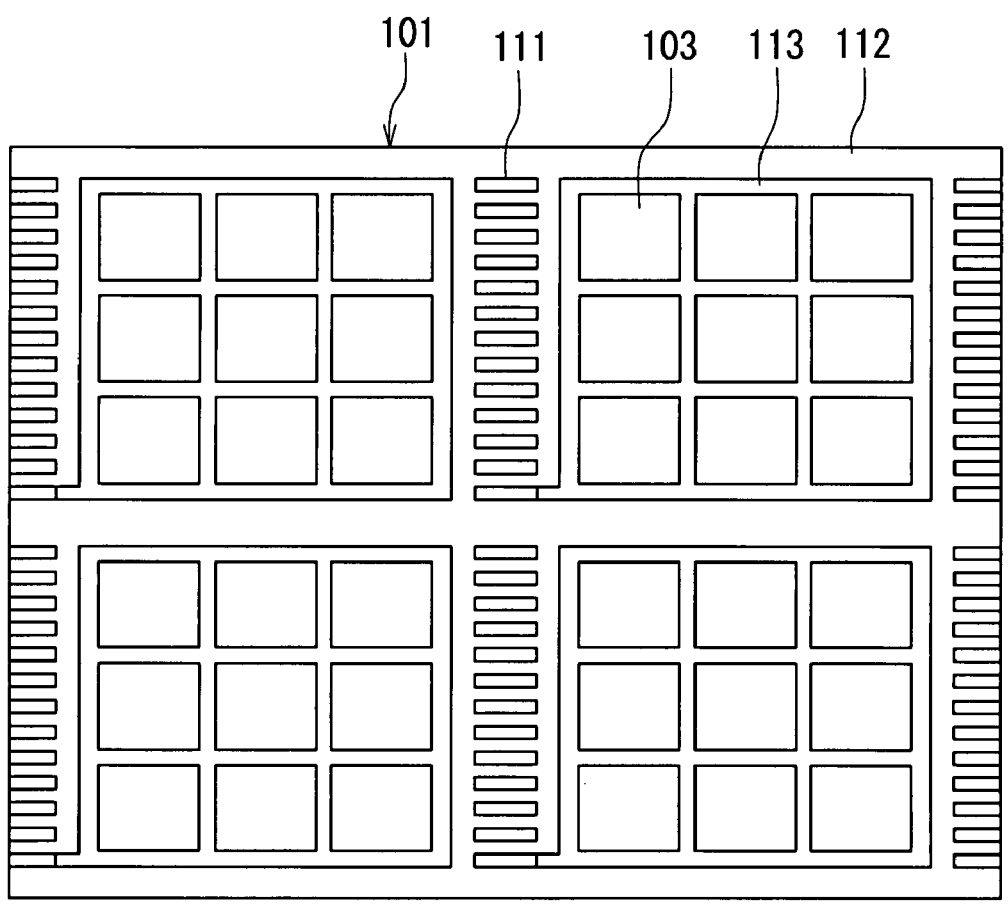
FIG. 10 is a top view illustrating part of a stack of layers obtained in a step that follows the step of FIG. 9.
Figure 15:
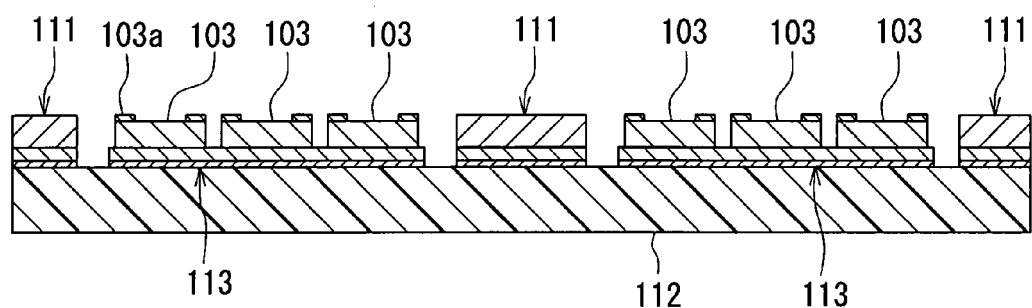
FIG. 15 is a cross-sectional view illustrating part of a stack of layers obtained in a step that follows the step of FIG. 14.

FIG. 10 and FIG. 15 illustrate the next step. FIG. 10 is a top view illustrating part of a stack of layers fabricated in this step. FIG. 15 is a cross-sectional view illustrating part of the stack of layers fabricated in this step. In this step, at least one chip 103 is bonded to each of the chip bonding conductor layers 113 of each of the pre-base portions 110. FIG. 10 and FIG. 15 illustrate an example in which nine chips 103 are bonded to each of the chip bonding conductor layers 113. Each of the chips 103 has a top surface, a bottom surface, and a plurality of electrodes 103a disposed on the top surface. Each of the chips 103 is disposed such that the bottom surface is bonded to the chip bonding conductor layer 113. The top surfaces of the electrodes 103a are located at the same height or nearly the same height as the top surfaces of the leads 111.

Figure 11:
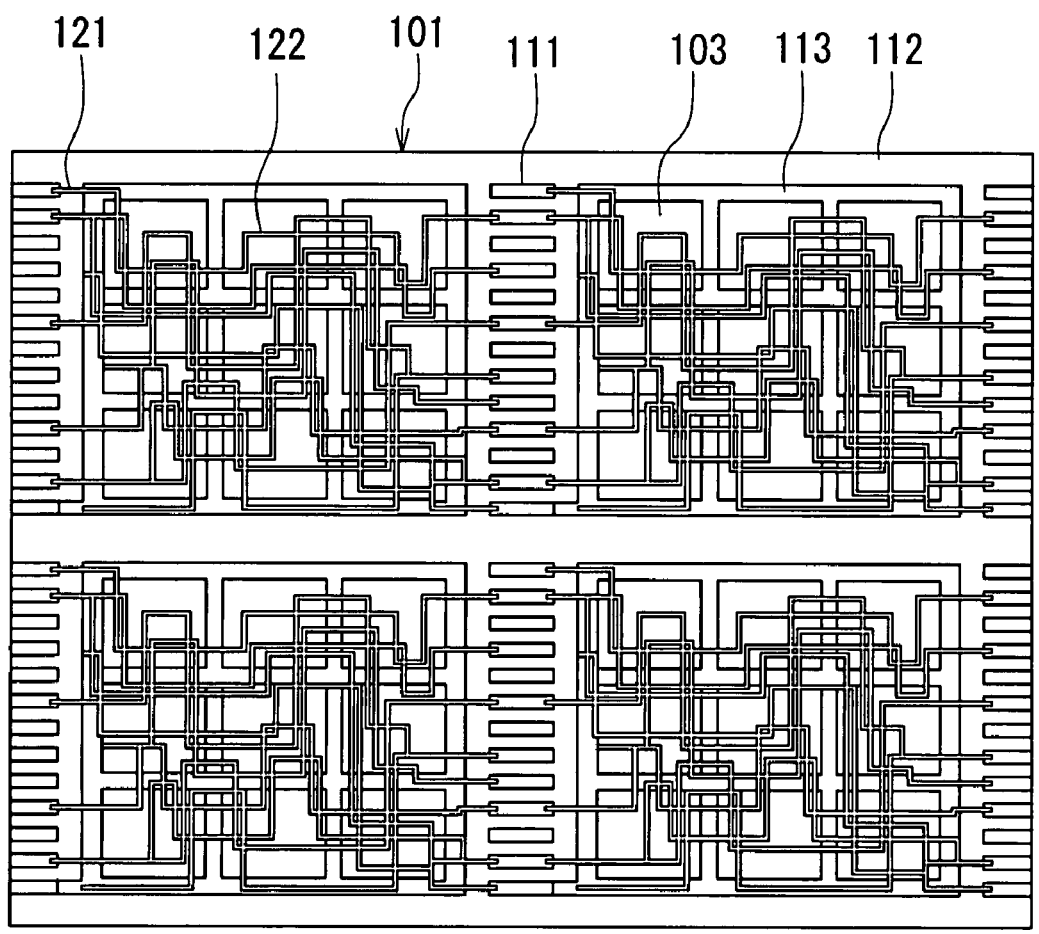
FIG. 11 is a top view illustrating part of a stack of layers obtained in a step that follows the step of FIG. 10.
Figure 16:
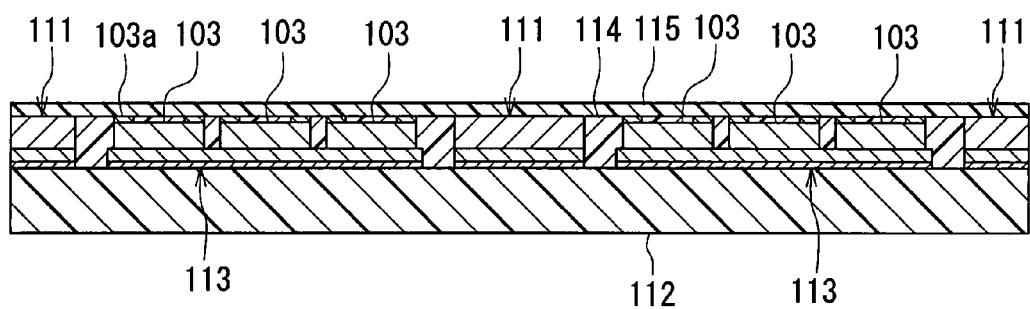
FIG. 16 is a cross-sectional view illustrating part of a stack of layers obtained in a step that follows the step of FIG. 15.
Figure 17:
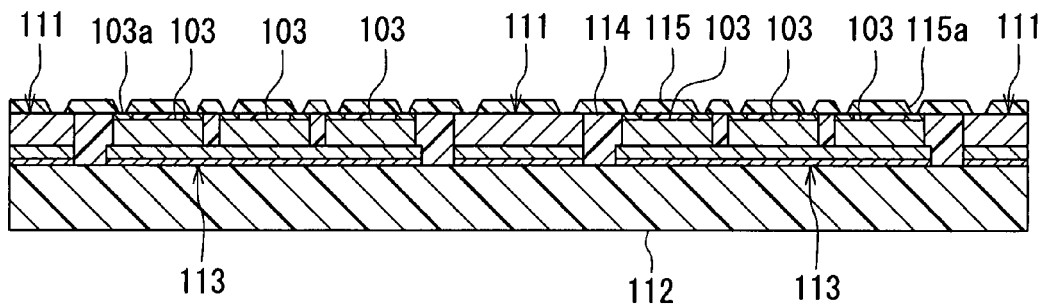
FIG. 17 is a cross-sectional view illustrating part of a stack of layers obtained in a step that follows the step of FIG. 16.
Figure 18:
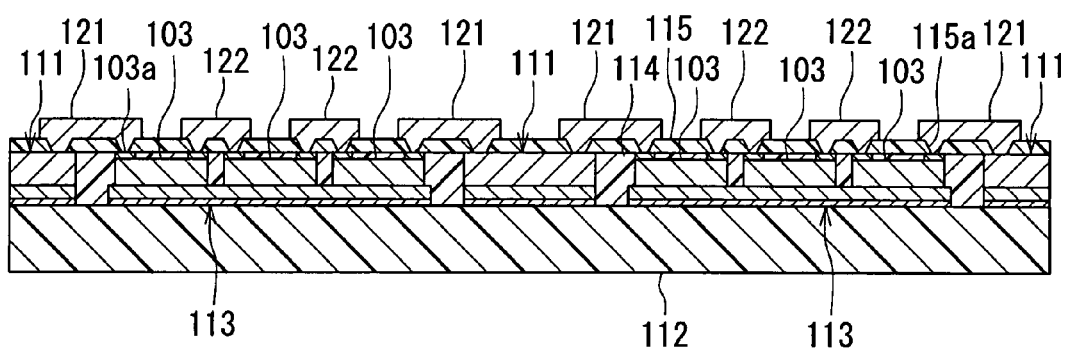
FIG. 18 is a cross-sectional view illustrating part of a stack of layers obtained in a step that follows the step of FIG. 17.

Next, the step of forming lead connecting portions and inter-chip connecting portions is performed. This step will now be described with reference to FIG. 11 and FIG. 16 to FIG. 18. FIG. 11 is a top view illustrating part of a stack of layers fabricated in this step. FIG. 16 is a cross-sectional view illustrating part of a stack of layers obtained in a step that follows the step illustrated in FIG. 15. FIG. 17 is a cross-sectional view illustrating part of a stack of layers obtained in a step that follows the step of FIG. 16. FIG. 18 is a cross-sectional view illustrating part of a stack of layers obtained in a step that follows the step of FIG. 17.

In this step, first, as illustrated in FIG. 16, an insulating layer 114 is formed so that the recessed portions of the stack of layers illustrated in FIG. 15 are filled with the insulating layer 114. For example, the insulating layer 114 may be formed by making the recessed portions of the stack of layers of FIG. 15 be filled with an uncured polyimide resin, flattening the top surface thereof, and then hardening the polyimide resin at a temperature of 200° C. or lower. The top surface of the stack of layers is thereby flattened. Next, an insulating layer 115 is formed on the flattened top surface of the stack of layers. For example, the insulating layer 115 may be formed of a photosensitive material such as a polyimide resin containing a sensitizer. The top surface of the insulating layer 115 is also flattened.

Next, as illustrated in FIG. 17, a plurality of openings (via holes) 115a for exposing the leads 111 and the electrodes 103a are formed in the insulating layer 115. In the case where the insulating layer 115 is formed of a photosensitive material, it is possible to form the openings 115a in the insulating layer 115 by photolithography. In the case where the insulating layer 115 is formed of a non-photosensitive material, it is possible to form the openings 115a in the insulating layer 115 by selectively etching the insulating layer 115.

Next, as illustrated in FIG. 11 and FIG. 18, a plurality of lead connecting portions 121 and a plurality of inter-chip connecting portions 122 are formed at the same time by plating such as frame plating. Each of the lead connecting portions 121 electrically connects at least one of the electrodes 103a and at least one of the leads 111 to each other. Each of the inter-chip connecting portions 122 electrically connects the electrodes 103a of the plurality of chips 103 disposed in one pre-base portion 110 to each other. The lead connecting portions 121 and the inter-chip connecting portions 122 can be made of any of Cu, Ni, Cr, Fe and Au, for example. Among these materials, Cu or Au is preferred because of its high conductivity. In FIG. 11 illustrations of the insulating layers 114 and 115 are omitted. When the lead connecting portions 121 and the inter-chip connecting portions 122 are formed, a connecting portion for connecting different ones of the electrodes of each chip 103 to each other, or a connecting portion for connecting different ones of the leads 111 to each other may be formed at the same time.

Figure 12:
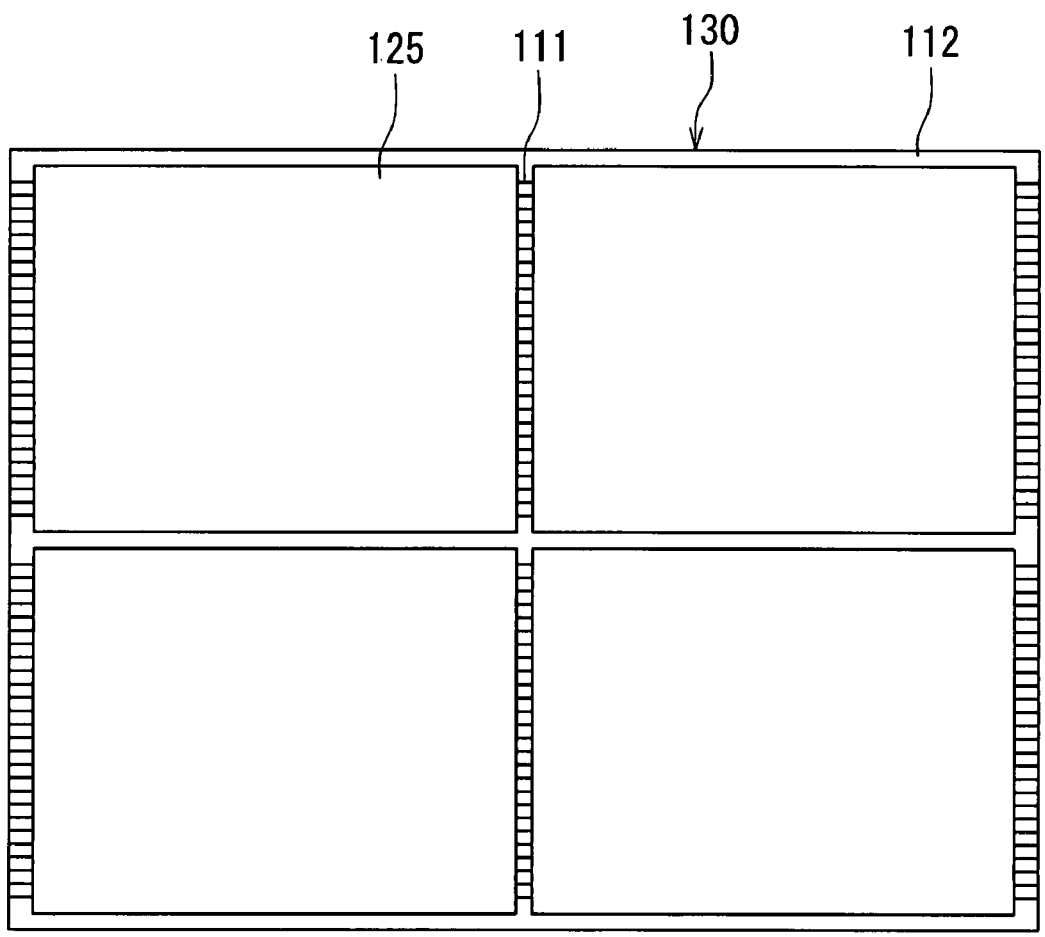
FIG. 12 is a top view illustrating part of a stack of layers obtained in a step that follows the step of FIG. 11.
Figure 19:
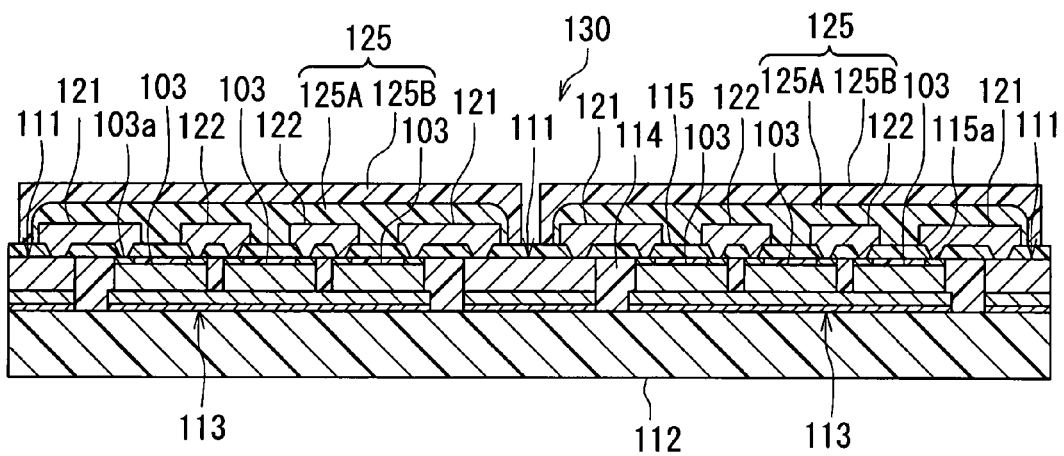
FIG. 19 is a cross-sectional view illustrating part of a stack of layers obtained in a step that follows the step of FIG. 18.

Next, the step of forming the sealer 125 is performed as necessary. This step will now be described with reference to FIG. 12 and FIG. 19. FIG. 12 is a top view illustrating part of a stack of layers fabricated in this step. FIG. 19 is a cross-sectional view illustrating part of the stack of layers fabricated in this step. Illustration of the insulating layer 115 is omitted in FIG. 12. In this step, first, as illustrated in FIG. 19, a first sealing layer 125A is formed to cover the lead connecting portions 121 and the inter-chip connecting portions 122. Next, a second sealing layer 125B is formed to cover the first sealing layer 125A. Before forming the first sealing layer 125A, a passivation film may be formed, if necessary, to cover the lead connecting portions 121 and the inter-chip connecting portions 122. The second sealing layer 125B can be made of a typical mold resin or a ceramic. The first sealing layer 125A is provided for preventing damage to the chips 103, the lead connecting portions 121 and the inter-chip connecting portions 122 resulting from a stress generated by the second sealing layer 125B. The first sealing layer 125A is made of a silicone resin, for example. The first sealing layer 125A and the second sealing layer 125B constitute the sealer 125 for sealing the chips 103. FIG. 12 and FIG. 19 illustrate an example in which individual sealers 125 are formed for the respective pre-base portions 110. However, a single sealer 125 may be formed to seal all the chips 103 of all the pre-base portions 110. Each substructure 130 is thus fabricated.

Figure 20:
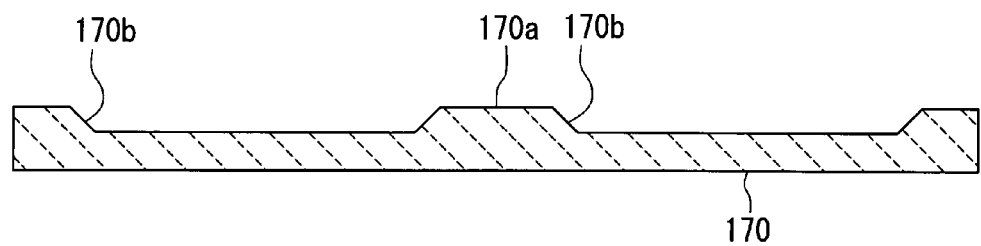
FIG. 20 is a cross-sectional view illustrating part of a wafer main body used in a second example of the method of fabricating the substructure in the embodiment of the invention.

A second example of the method of fabricating each substructure 130 will now be described with reference to FIG. 20 to FIG. 26. FIG. 20 is a cross-sectional view illustrating part of a wafer main body used in the second example of the method of fabricating the substructure 130. FIG. 21 to FIG. 26 are cross-sectional views illustrating part of the stack of layers fabricated in the respective steps of the second example of the method of fabricating the substructure 130.

The second example of the method of fabricating each substructure 130 starts with fabrication of a wafer main body 170 illustrated in FIG. 20. The wafer main body 170 is in the form of a plate having a top surface 170a. The top surface 170a has a plurality of recessed portions 170b in which the plurality of chip bonding conductor layers 113 will be respectively disposed later. For example, the recessed portions 170b can be formed by partially etching the top surface of the wafer main body 170 which is initially flat. For example, in a case where the wafer main body 170 is made of silicon, the recessed portions 170b can be formed by performing wet etching using KOH as an etchant. The recessed portions 170b each have a depth within a range of 30 to 300 µm, for example.

Figure 21:
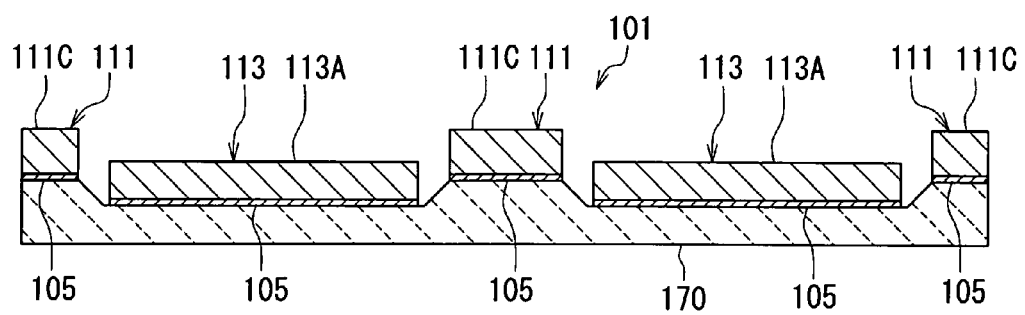
FIG. 21 is a cross-sectional view illustrating part of a stack of layers fabricated in a step of the second example of the method of fabricating the substructure in the embodiment of the invention.

FIG. 21 illustrates the next step. In this step, first, the seed layer 105 for plating is formed by sputtering, for example, to entirely cover the top surface 170a of the wafer main body 170. The thickness and material of the seed layer 105 are the same as those of the first example.

Next, on the seed layer 105, a plurality of lead plating layers 111C that are to constitute the plurality of leads 111 and a plurality of chip bonding plating layers 113A that are to constitute the plurality of chip bonding conductor layers 113 are formed by plating such as frame plating. The lead plating layers 111C are located above portions of the top surface 170a of the wafer main body 170 other than the recessed portions 170b. The chip bonding plating layers 113A are disposed in the recessed portions 170b. Each of the plating layers 111C and 113A has a thickness within a range of 30 to 500 µm, for example. The plating layers 111C and 113A can be made of any of Cu, Ni, Fe, Ru and Cr, or an alloy containing any of these, or NiFe or CoNiFe, for example.

Next, the seed layer 105 except portions thereof located below the plating layers 111C and 113A is removed by etching using the plating layers 111C and 113A as masks. As a result, the leads 111 are formed of the lead plating layers 111C and portions of the seed layer 105 remaining therebelow. In addition, the chip bonding conductor layers 113 are formed of the chip bonding plating layers 113A and portions of the seed layer 105 remaining therebelow. The wafer 101 is thus fabricated.

A difference in level is formed between the top surface of each lead 111 and the top surface of each chip bonding conductor layer 113 so that the top surface of each lead 111 is located higher than the top surface of each chip bonding conductor layer 113. This difference in level is preferably equal to or nearly equal to the thickness of the chips 103 that will be disposed on the chip bonding conductor layers 113 later.

Figure 22:
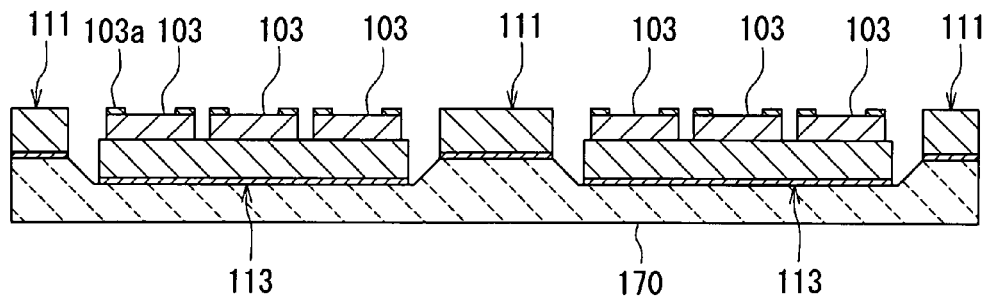
FIG. 22 is a cross-sectional view illustrating part of a stack of layers obtained in a step that follows the step of FIG. 21.

FIG. 22 illustrates the next step. In this step, at least one chip 103 is bonded to each of the chip bonding conductor layers 113 of each of the pre-base portions 110. Each of the chips 103 has a top surface, a bottom surface, and a plurality of electrodes 103a disposed on the top surface. Each of the chips 103 is disposed such that the bottom surface is bonded to the chip bonding conductor layer 113. The top surfaces of the electrodes 103a are located at the same height or nearly the same height as the top surfaces of the leads 111.

Figure 23:
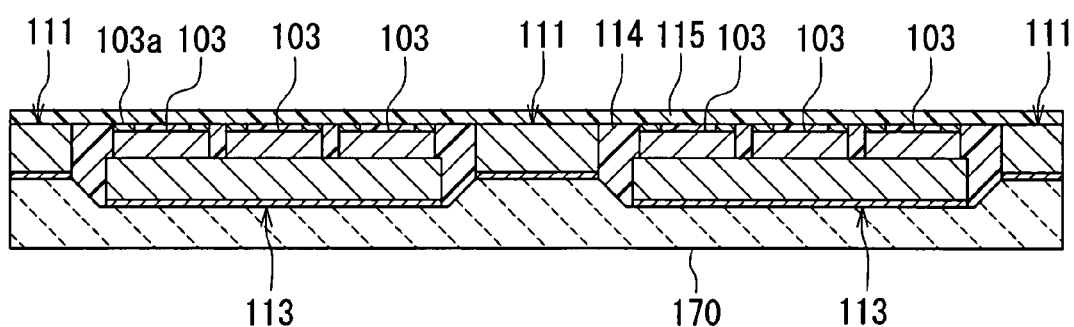
FIG. 23 is a cross-sectional view illustrating part of a stack of layers obtained in a step that follows the step of FIG. 22.

FIG. 23 illustrates the next step. In this step, the insulating layers 114 and 115 are formed in the manner as described in the first example. The top surface of the insulating layer 115 is flattened.

Figure 24:
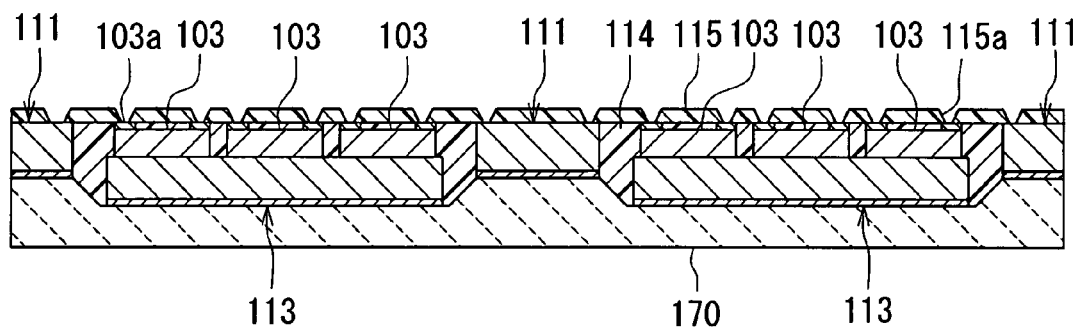
FIG. 24 is a cross-sectional view illustrating part of a stack of layers obtained in a step that follows the step of FIG. 23.

FIG. 24 illustrates the next step. In this step, in the manner as described in the first example, a plurality of openings (via holes) 115a for exposing the leads 111 and the electrodes 103a are formed in the insulating layer 115.

Figure 25:
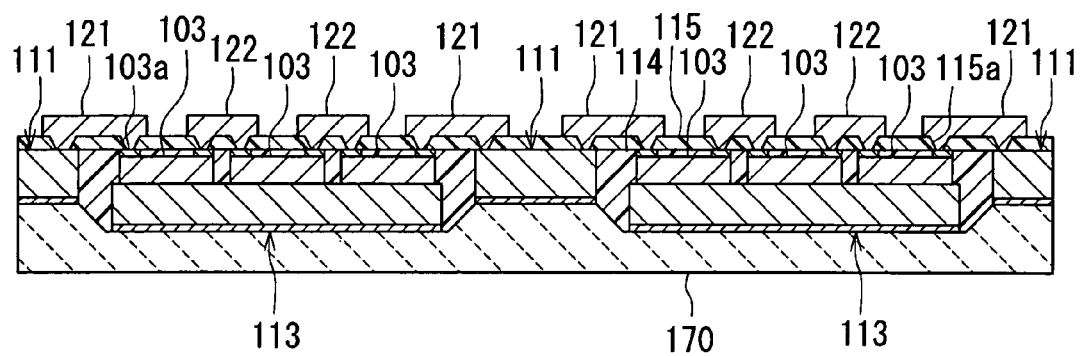
FIG. 25 is a cross-sectional view illustrating part of a stack of layers obtained in a step that follows the step of FIG. 24.

FIG. 25 illustrates the next step. In this step, in the manner as described in the first example, a plurality of lead connecting portions 121 and a plurality of inter-chip connecting portions 122 are formed at the same time by plating such as frame plating. When the lead connecting portions 121 and the inter-chip connecting portions 122 are formed, a connecting portion for connecting different ones of the electrodes of each chip 103 to each other, or a connecting portion for connecting different ones of the leads 111 to each other may be formed at the same time.

Figure 26:
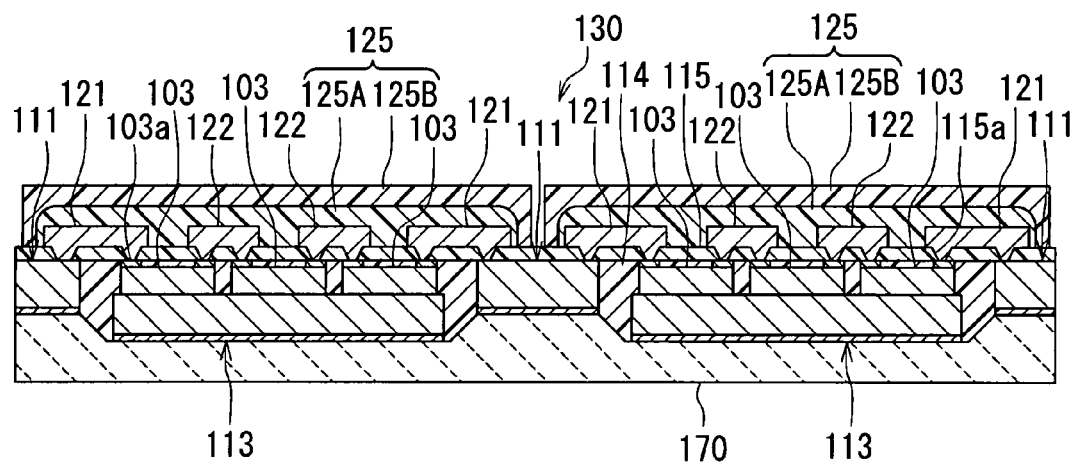
FIG. 26 is a cross-sectional view illustrating part of a stack of layers obtained in a step that follows the step of FIG. 25.

FIG. 26 illustrates the next step. In this step, in the manner as described in the first example, the first sealing layer 125A is formed to cover the lead connecting portions 121 and the inter-chip connecting portions 122, and then the second sealing layer 125B is formed to cover the first sealing layer 125A. The first sealing layer 125A and the second sealing layer 125B constitute the sealer 125 for sealing the chips 103. FIG. 26 illustrates an example in which individual sealers 125 are formed for the respective pre-base portions 110. However, a single sealer 125 may be formed to seal all the chips 103 of all the pre-base portions 110. Each substructure 130 is thus fabricated.

In the method of manufacturing the electronic component package 1 of the embodiment, as has been described with reference to FIG. 6 and FIG. 7, the main body aggregate 160 is fabricated using the wafer 150 for cap layer and a plurality of substructures 130 that respectively correspond to the plurality of layer portions 10, 20, 30 and 40 of the electronic component package 1. In the embodiment, next, the following steps are performed: forming the wiring 3 for each of the pre-main-body portions 2P of the main body aggregate 160; and cutting the main body aggregate 160 after the formation of the wiring 3 so as to separate the plurality of pre-main-body portions 2P from each other so that each of them becomes the main body 2 and a plurality of electronic component packages 1 are thereby formed. These steps will now be described in detail.

In the step of forming the wiring 3, a plurality of main body aggregates 160 are arranged in the direction of stacking of the plurality of layer portions 10, 20, 30 and 40, and they are bonded to each other to fabricate a structure. Then, the wiring 3 is formed for each of the pre-main-body portions 2P of the plurality of main body aggregates 160 included in the structure, and thereafter the plurality of main body aggregates 160 included in the structure are separated from each other.

Figure 27:
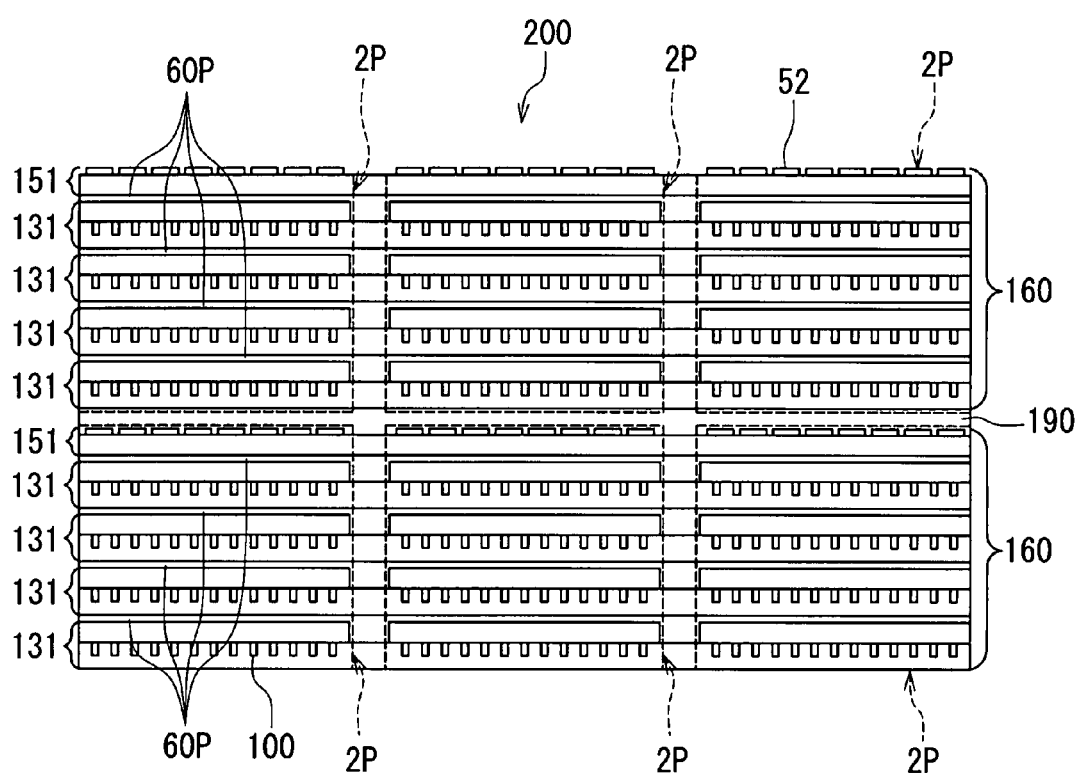
FIG. 27 is a side view illustrating an example of a structure that includes two main body aggregates bonded to each other.
Figure 28:
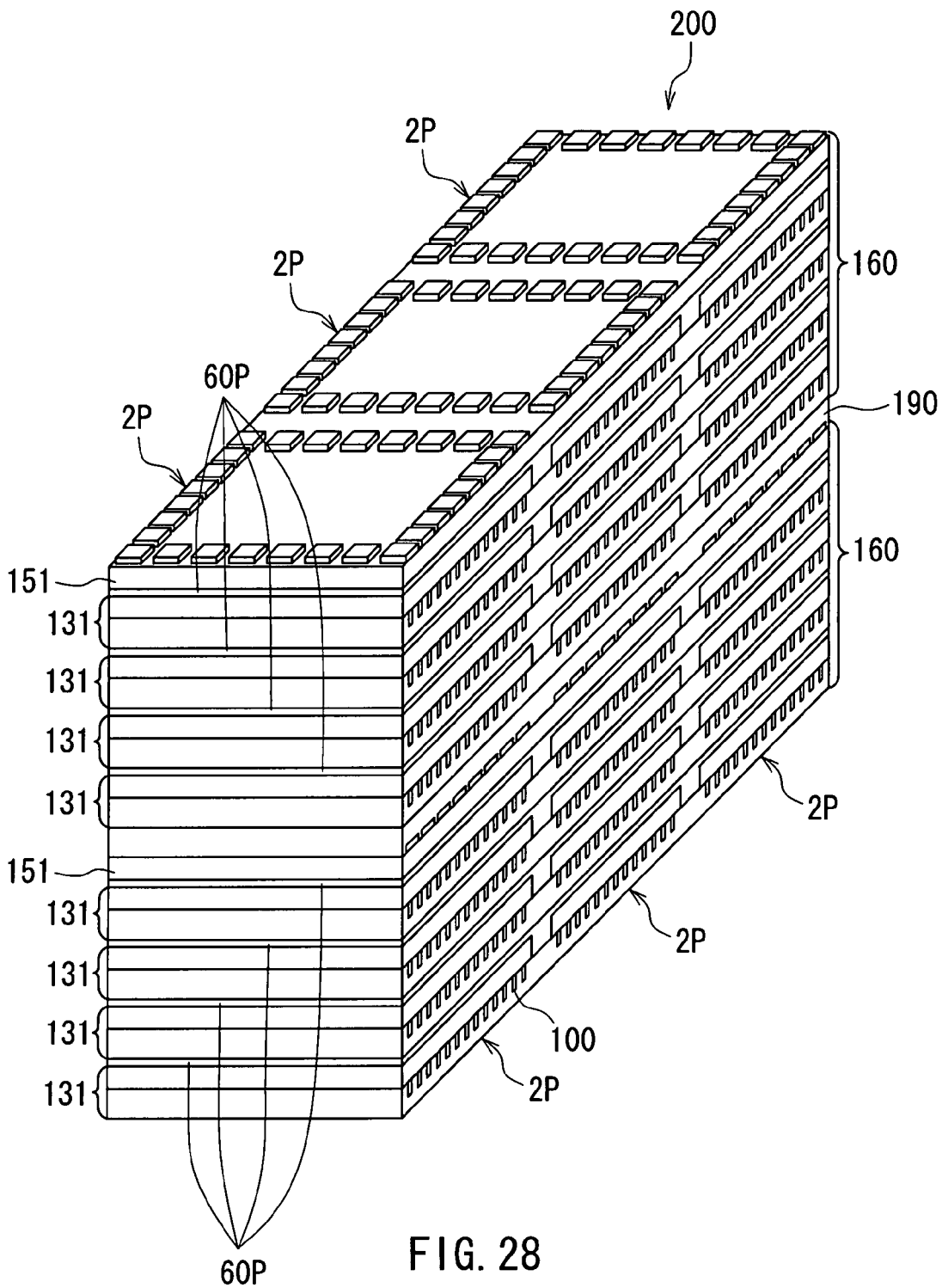
FIG. 28 is a perspective view of the structure illustrated in FIG. 27.

FIG. 27 is a side view illustrating an example of the structure that includes two main body aggregates 160 bonded to each other. FIG. 28 is a perspective view illustrating the structure of FIG. 27. In this example, two main body aggregates 160 arranged in the direction of stacking of the plurality of layer portions 10, 20, 30 and 40 are bonded to each other by an adhesive layer 190 made of an adhesive so as to fabricate the structure 200. The adhesive layer 190 is to be removed later. An adhesive that is easily peelable and removable is therefore used to form the adhesive layer 190. Examples of the adhesive suitable to form the adhesive layer 190 include a hot-melt-type adhesive and a relatively soft rubber-base adhesive such as a silicone-rubber-base adhesive.

Each of the main body aggregates 160 has a plurality of elements 131 that respectively correspond to the layer portions 10, 20, 30 and 40, and the element 151. Every two of the elements adjacent to each other in the vertical direction are bonded to each other by an adhesive layer 60P made of an adhesive. In addition, each of the main body aggregates 160 includes a plurality of pre-main-body portions 2P each of which is to become the main body 2 later, the pre-main-body portions 2P being arranged in one direction that is orthogonal to the direction of stacking of the plurality of layer portions 10, 20, 30 and 40. In the example illustrated in FIG. 27 and FIG. 28, each of the elements 131 has a plurality of sealers 125 for sealing the plurality of chips 103.

Figure 29:
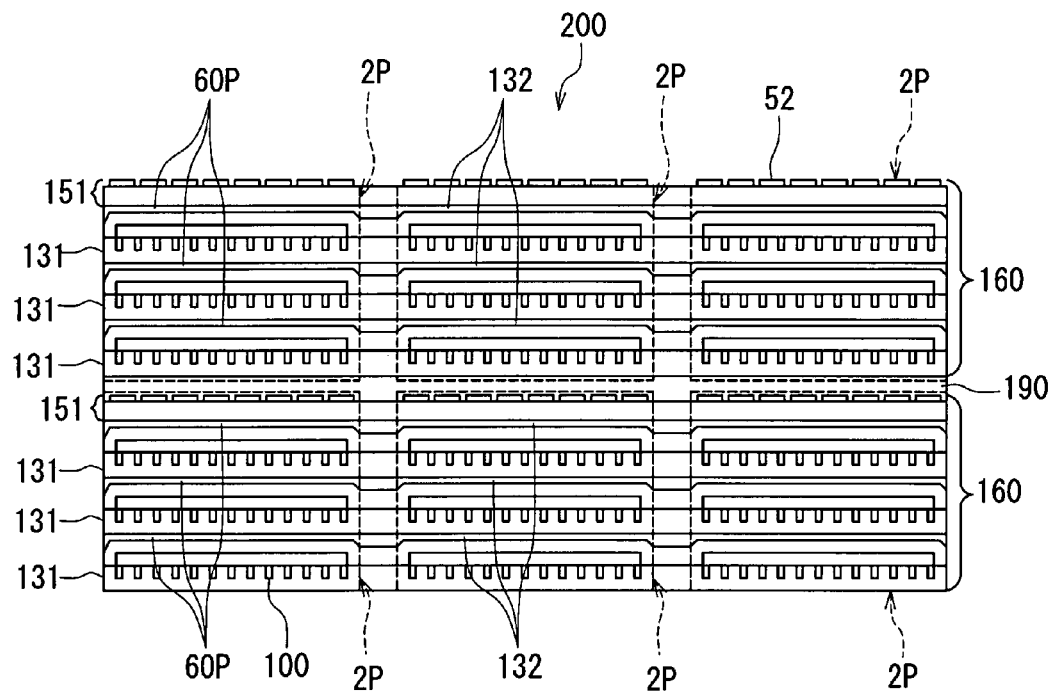
FIG. 29 is a side view illustrating another example of the structure that includes two main body aggregates bonded to each other.

FIG. 29 is a side view illustrating another example of the structure 200 that includes two main body aggregates 160. In this example, each of the elements 131 does not have a plurality of sealers 125 for sealing the plurality of chips 103. In this example, when fabricating each main body aggregate 160, a resin layer 132 is provided to cover the top surfaces of the elements 131, and then every two of the elements adjacent to each other in the vertical direction are bonded to each other by the adhesive layer 60P made of an adhesive. The resin layer 132 is made of silicone resin, for example. The remainder of configuration of the structure 200 of FIG. 29 is the same as that of the structure 200 of FIG. 27.

The structure 200 has a first side surface and a second side surface opposite to the first side surface. At the first side surface of the structure 200, first side surfaces of all the layer portions included in the structure 200 appear. At the second side surface of the structure 200, second side surfaces opposite to the first side surfaces of all the layer portions included in the structure 200 appear. FIG. 27 and FIG. 29 illustrate the first side surface of the structure 200.

Figure 30:
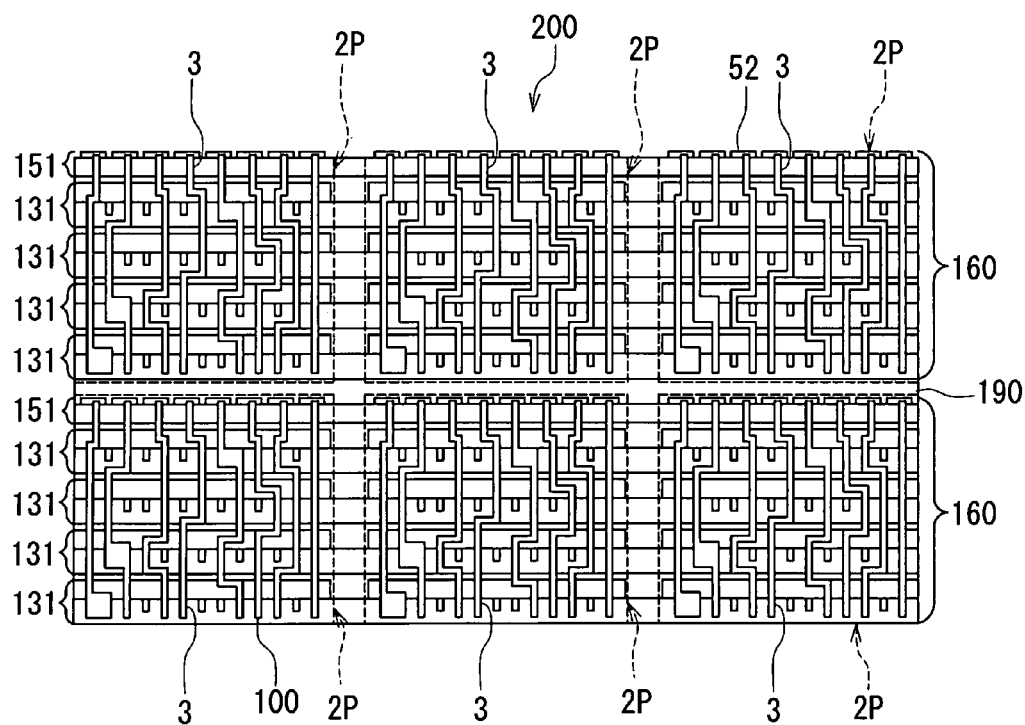
FIG. 30 is a side view of the structure having undergone the formation of wiring.
Figure 31:
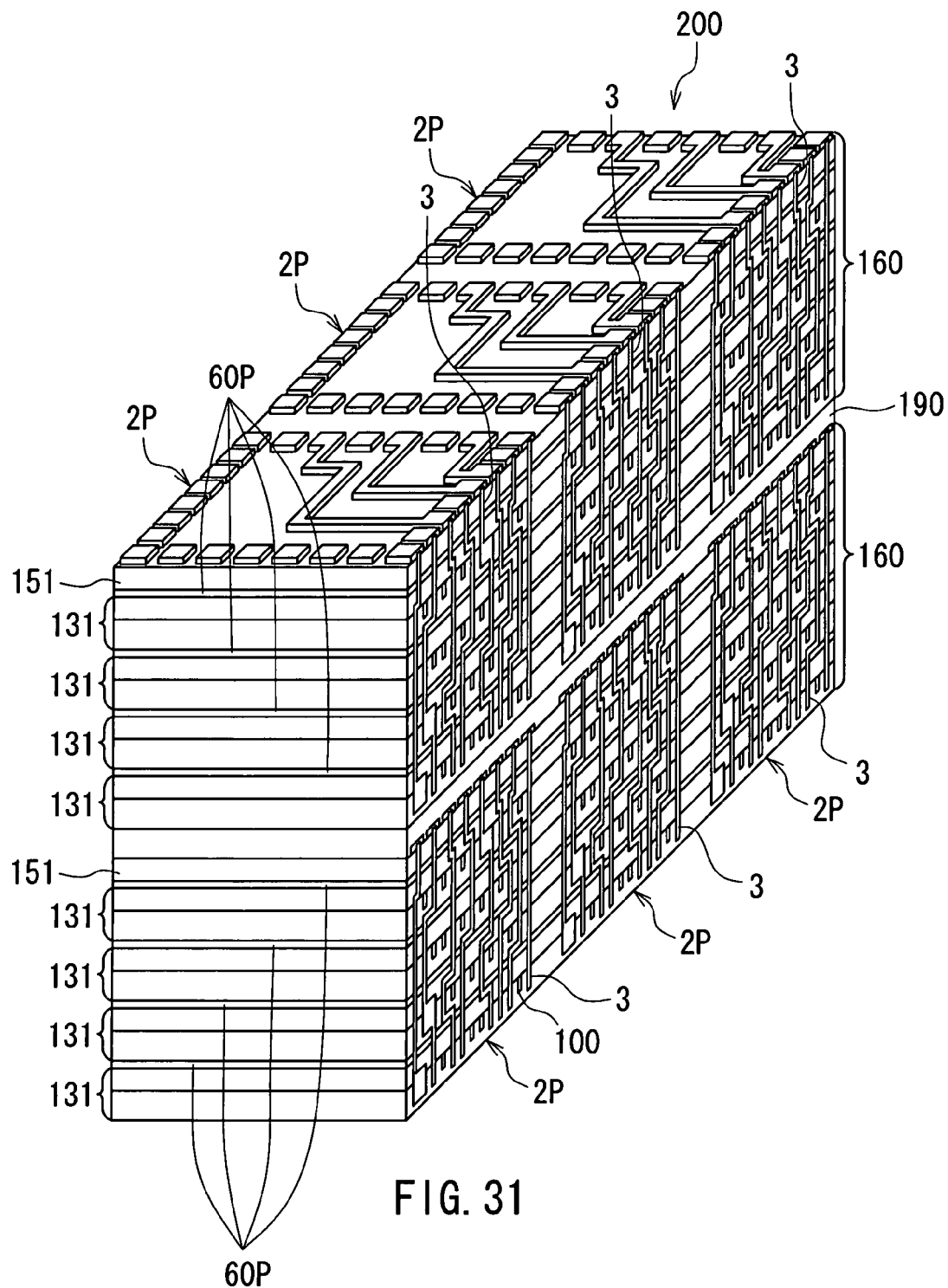
FIG. 31 is a perspective view of the structure having undergone the formation of wiring.

In the embodiment, after the structure 200 is fabricated, the first side surface and the second side surface of the structure 200 are polished. Then, on at least one of the first and the second side surface of the structure 200, the wiring 3 is formed for each of the pre-main-body portions 2P of the plurality of main body aggregates 160 included in the structure 200. FIG. 30 is a side view of the structure 200 having undergone the formation of the wiring 3. FIG. 31 is a perspective view of the structure 200 having undergone the formation of the wiring 3.

Here, an example of a method of forming the wiring 3 will be described. In this method, first, a seed layer for plating is formed by sputtering, for example, on the side surface of the structure 200 on which the wiring 3 is to be formed. Next, a frame for plating is formed on the seed layer by photolithography. This frame has openings formed in a region where the wiring 3 is to be formed. This frame is formed by, for example, patterning a photoresist film having a thickness of 10 to 50 µm by photolithography. Next, plating layers are formed in the openings of the frame. The frame is then removed. Next, the seed layer except portions thereof located below the plating layers is removed by etching. As a result, the wiring 3 is formed of the plating layers and the remaining portions of the seed layer.

Figure 32:
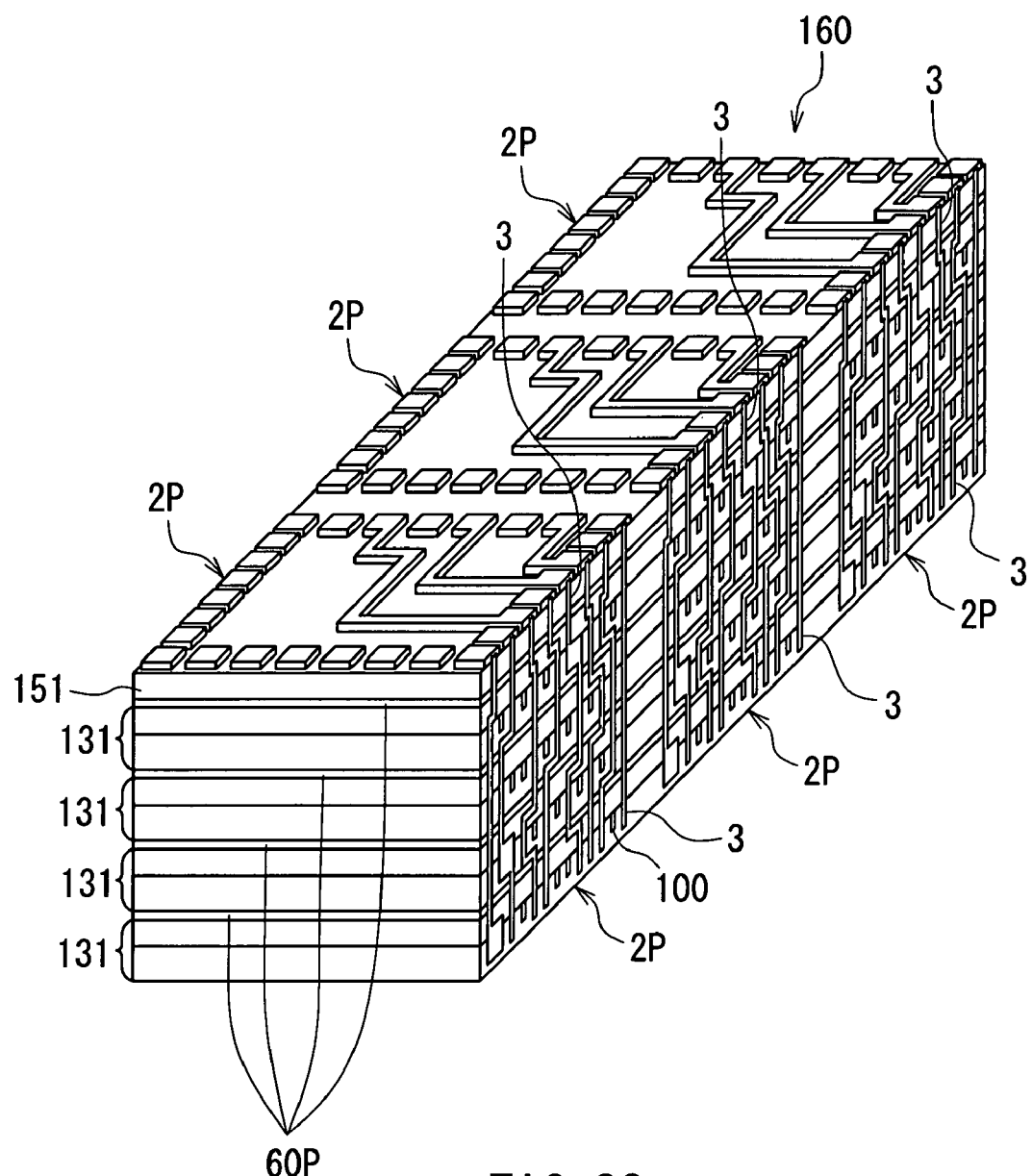
FIG. 32 is a perspective view of one main body aggregate with wiring formed thereon.

In the embodiment, after the wiring 3 is formed, the plurality of main body aggregates 160 included in the structure 200 are separated from each other by removing the adhesive layer 190. FIG. 32 illustrates one main body aggregate 160 with the wiring 3 formed thereon.

Figure 33:
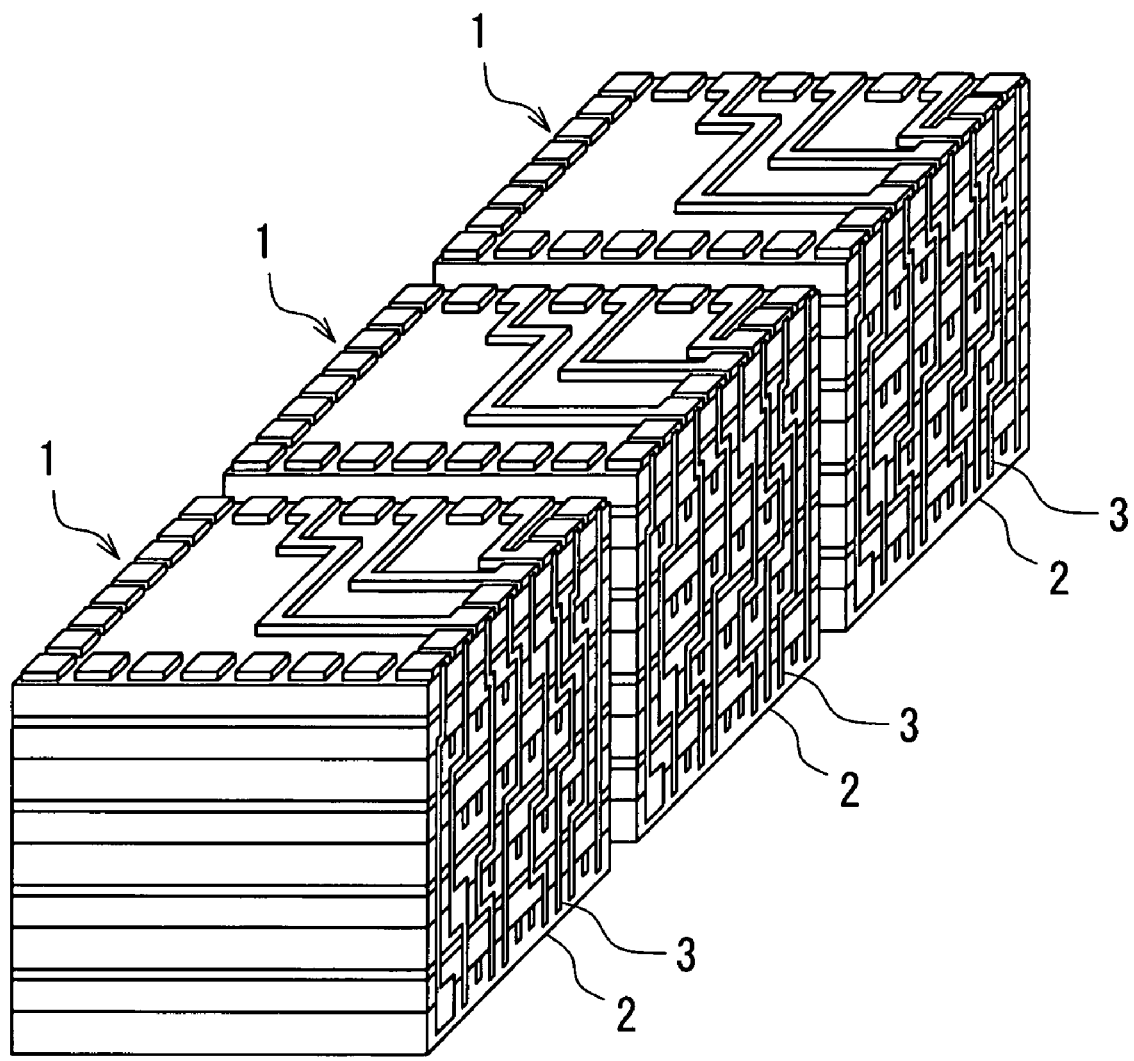
FIG. 33 is a perspective view illustrating the step of cutting the main body aggregate with wiring formed thereon.

In the embodiment, next, as illustrated in FIG. 33, the main body aggregate 160 is cut so as to separate the plurality of pre-main-body portions 2P from each other so that each of them becomes the main body 2 and a plurality of electronic component packages 1 are thereby formed. In this way, a plurality of electronic component package 1 of FIG. 1 are manufactured at the same time.

As has been described above, the method of manufacturing the electronic component package 1 of the embodiment includes the steps of: fabricating the main body aggregate 160 including a plurality of pre-main-body portions 2P each of which will become the main body 2 later, the pre-main-body portions 2P being arranged in one direction that is orthogonal to the direction of stacking of the plurality of layer portions 10, 20, 30 and 40; forming the wiring 3 for each of the pre-main-body portions 2P of the main body aggregate 160; and cutting the main body aggregate 160 after the formation of the wiring 3 so as to separate the plurality of pre-main-body portions 2P from each other so that each of them becomes the main body 2 and a plurality of electronic component packages 1 are thereby formed. According to the method of manufacturing the electronic component package 1 of the embodiment, it is thus possible to mass-produce the layered electronic component packages 1 that are capable of attaining higher integration by incorporating the plurality of layer portions 10, 20, 30 and 40.

In the embodiment, the main body aggregate 160 is not one formed by bonding a plurality of main bodies 2 separated from each other. In the embodiment, the plurality of pre-main-body portions 2P are not separated from each other until the main body aggregate 160 is cut after forming the wiring 3 for each of the pre-main-body portions 2P. Consequently, the method of manufacturing the electronic component package 1 of the embodiment does not include a step of bonding a plurality of main bodies 2 to fabricate the main body aggregate 160. Furthermore, according to the embodiment, it is not required to align the plurality of pre-main-body portions 2P to fabricate the main body aggregate 160. As a result, according to the embodiment, it is possible to mass-produce the electronic component packages 1 easily and precisely.

Furthermore, in the embodiment, in the step of forming the wiring 3, the structure 200 is fabricated by arranging a plurality of main body aggregates 160 in the direction of stacking of the plurality of layer portions 10, 20, 30 and 40 and bonding the aggregates 160 to each other, the wiring 3 is then formed for each of the pre-main-body portions 2P of the plurality of main body aggregates 160 included in the structure 200, and then the plurality of main body aggregates 160 included in the structure 200 are separated from each other. Consequently, according to the embodiment, it is possible to form the wiring 3 for a large number of pre-main-body portions 2P at a time. When fabricating the structure 200 by bonding a plurality of main body aggregates 160, it is necessary to align the plurality of main body aggregates 160. According to the embodiment, however, since the positional relationship between the plurality of pre-main-body portions 2P in each main body aggregate 160 is fixed, it is much easier to align a plurality of main body aggregates 160 as compared with a case where the structure 200 is fabricated by bonding a plurality of main bodies 2 separated from each other.

Furthermore, in the embodiment, a plurality of substructures 130 respectively corresponding to the plurality of layer portions 10, 20, 30 and 40 of the electronic component package 1 and the wafer 150 for cap layer are fabricated, and then the main body aggregate 160 is fabricated using them. In the step of fabricating each substructure 130, first, the wafer 101 having the plurality of sets of leads 111 and the wafer main body 112 is fabricated, and a plurality of chips 103 are bonded to the wafer 101. The wafer 101 includes no circuit element. Consequently, even if any alteration is required for the specifications of the electronic component package 1, no alteration is required for the wafer 101 at all, or even if some change in the number and/or arrangement of the leads 111 is required, it is easy to make such a change. In addition, according to the embodiment, it is easy to alter the specifications of the electronic component package 1 by modifying the chips 103 to be disposed in each of the pre-base portions 110 of the wafer 101. Because of these features of the embodiment, it is possible to flexibly and quickly respond to alterations to the specifications of the electronic component package 1.

In the embodiment, any combination is possible for the plurality of chips 103 included in the electronic component package 1. Examples of combination of the plurality of chips 103 include a combination of two or more circuit elements of the same type or different types selected from C-MOS integrated circuit elements, high-speed C-MOS integrated circuit elements, high-withstand C-MOS integrated circuit elements, bipolar integrated circuit elements, high-speed bipolar integrated circuit elements, and high-withstand bipolar integrated circuit elements. Furthermore, a plurality of memory elements such as flash memory, SRAM, DRAM or PROM may be provided as the plurality of chips 103. It is thereby possible to manufacture the electronic component package 1 that functions as a memory element having a large storage capacity. Furthermore, a sensor or an actuator formed by using the MEMS and a driver circuit element for driving it may be provided in the electronic component package 1.

In the embodiment, in each of the layer portions, the top surfaces of the leads 111 are located at the same height or nearly the same height as the top surfaces of the electrodes 103a of the chips 103. As a result, it is possible to easily connect the chips 103 to the leads 111 through the lead connecting portions 121, and it is possible to form the lead connecting portions 121 precisely.

It is possible to use the electronic component package 1 of FIG. 1 as it is as a single electronic component. For example, the electronic component package 1 is mountable on a wiring board by a flip-chip method by placing the electronic component package 1 on the wiring board such that the plurality of external connecting terminals 52 face downward. Furthermore, for example, if a device for use with the electronic component package 1 has a recessed portion to accommodate the electronic component package 1, the electronic component package 1 can be inserted to the recessed portion such that the plurality of external connecting terminals 52 face upward to thereby connect the external connecting terminals 52 to circuits in the device. Furthermore, the electronic component package 1 may be used in ways as illustrated in the following first to fourth examples.

Figure 34:
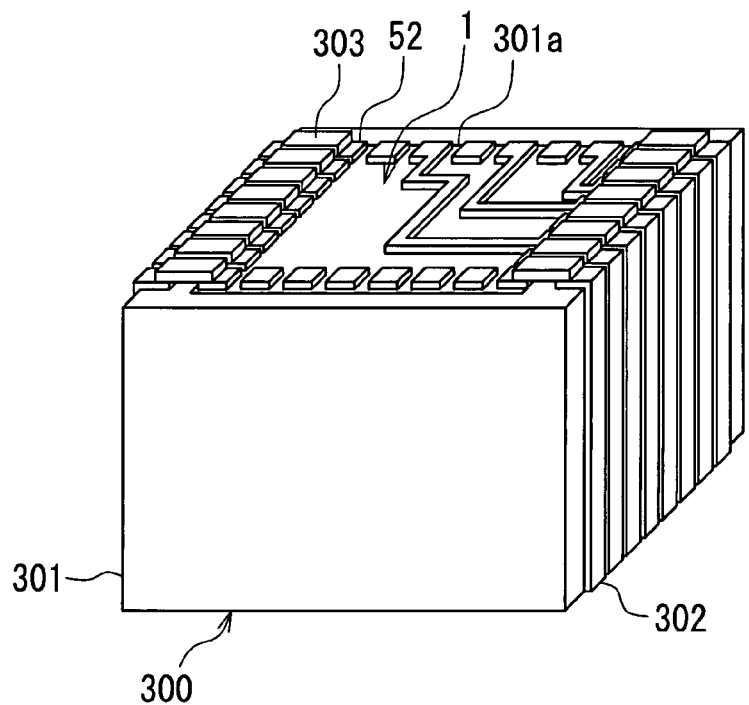
FIG. 34 is a perspective view illustrating a first example of use of the electronic component package of the embodiment of the invention.

FIG. 34 is a perspective view illustrating the first example of use of the electronic component package 1. The first example of use is an example of using the electronic component package 1 together with a case 300 for housing the electronic component package 1. The case 300 has a main body 301. The main body 301 has a top surface, a bottom surface, and four side surfaces. The main body 301 further has an encasing part 301a for housing the electronic component package 1. The encasing part 301a opens in the top surface of the main body 301. The case 300 further has a plurality of external connecting terminals 302. The plurality of external connecting terminals 302 extend from the top surface of the main body 301 to reach the bottom surface via the side surfaces. Alternatively, the plurality of external connecting terminals 302 may penetrate the main body 301 to extend from the top surface to the bottom surface of the main body 301. The electronic component package 1 is housed in the encasing part 301a. The plurality of external connecting terminals 52 of the electronic component package 1 and the plurality of external connecting terminals 302 of the case 300 are electrically connected to each other through a plurality of conductor layers 303. The plurality of conductor layers 303 are formed by plating, for example. In the first example of use, it is possible to connect the plurality of external connecting terminals 52 of the electronic component package 1 to conductor layers of a wiring board through the plurality of external connecting terminals 302 by, for example, placing the case 300 with the electronic component package 1 housed therein on the wiring board and connecting the plurality of external connecting terminals 302 to the conductor layers of the wiring board.

Figure 35:
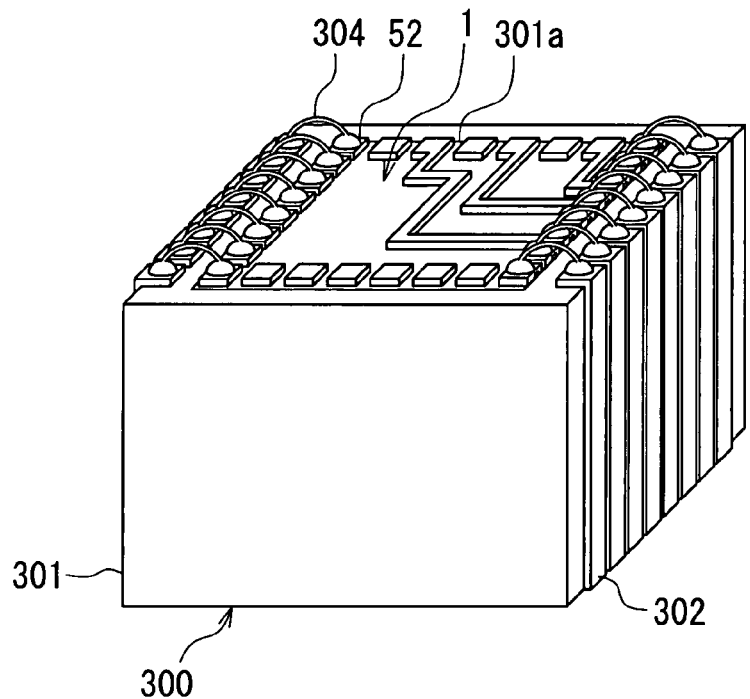
FIG. 35 is a perspective view illustrating a second example of use of the electronic component package of the embodiment of the invention.

FIG. 35 is a perspective view illustrating the second example of use of the electronic component package 1. The second example of use is an example in which the plurality of external connecting terminals 52 of the electronic component package 1 and the plurality of external connecting terminals 302 of the case 300 are connected to each other through a plurality of bonding wires 304 instead of the plurality of conductor layers 303 of the first example of use illustrated in FIG. 34. The remainder of features of the second example of use are the same as those of the first example of use.

Figure 36:
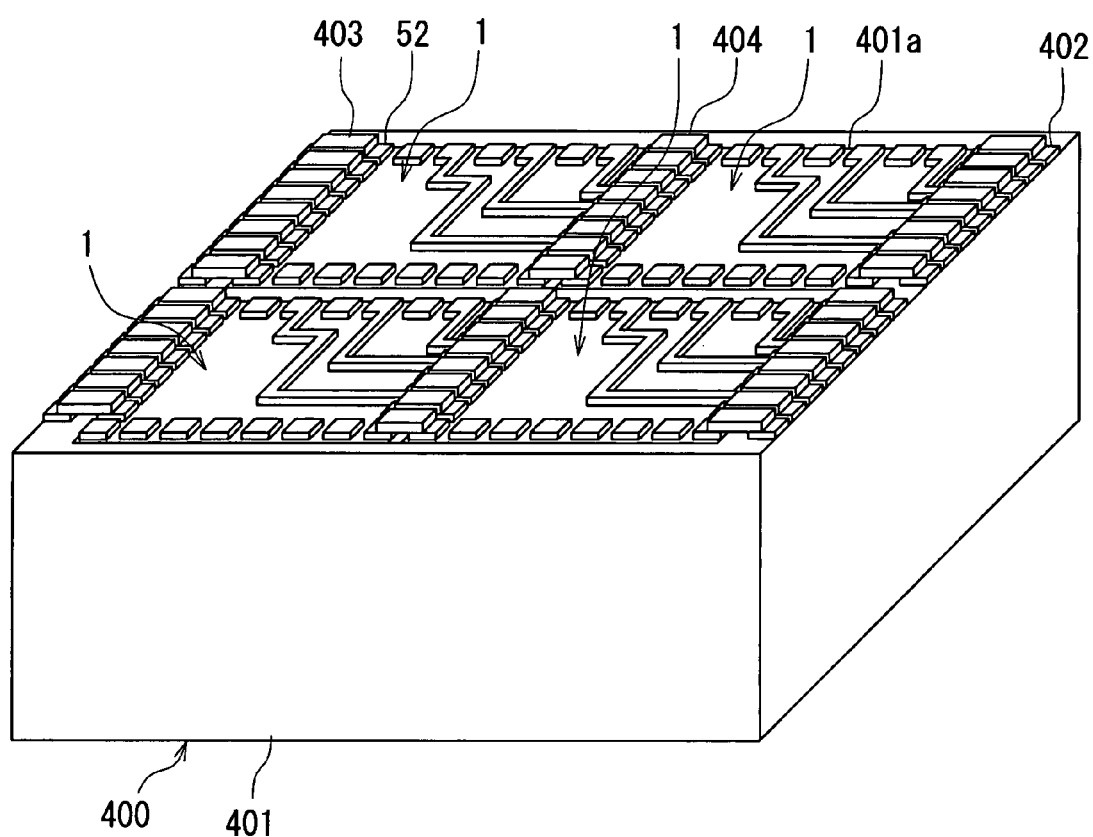
FIG. 36 is a perspective view illustrating a third example of use of the electronic component package of the embodiment of the invention.

FIG. 36 is a perspective view illustrating the third example of use of the electronic component package 1. The third example of use is an example of using a plurality of electronic component packages 1 together with a case 400 for housing the electronic component packages 1. The case 400 has a main body 401. The main body 401 has a top surface, a bottom surface, and four side surfaces. The main body 401 further has an encasing part 401a for housing the plurality of electronic component packages 1. FIG. 36 illustrates an example in which the encasing part 401a accommodates four electronic component packages 1. It suffices that the number of electronic component packages 1 that the encasing part 401a accommodates is not less than two. The encasing part 401a opens in the top surface of the main body 401. The case 400 further has a plurality of external connecting terminals 402. FIG. 36 illustrates an example in which the plurality of external connecting terminals 402 are located on the top surface of the main body 401. However, similarly to the first example of use illustrated in FIG. 34, the plurality of external connecting terminals 402 may extend from the top surface of the main body 401 to reach the bottom surface via the side surfaces, or may penetrate the main body 401 to extend from the top surface to the bottom surface of the main body 401. The plurality of external connecting terminals 52 of the electronic component packages 1 and the plurality of external connecting terminals 402 of the case 400 are electrically connected to each other through a plurality of conductor layers 403. Furthermore, in the example illustrated in FIG. 36, a plurality of ones of the external connecting terminals 52 of two adjacent electronic component packages 2 are electrically connected to each other through a plurality of conductor layers 404. The plurality of conductor layers 403 and 404 are formed by plating, for example. According to the third example of use, it is possible to use an aggregate of a plurality of electronic component packages 1 like a single electronic component. As a result, for example, it is possible to implement memory having a very large storage capacity.

Figure 37:
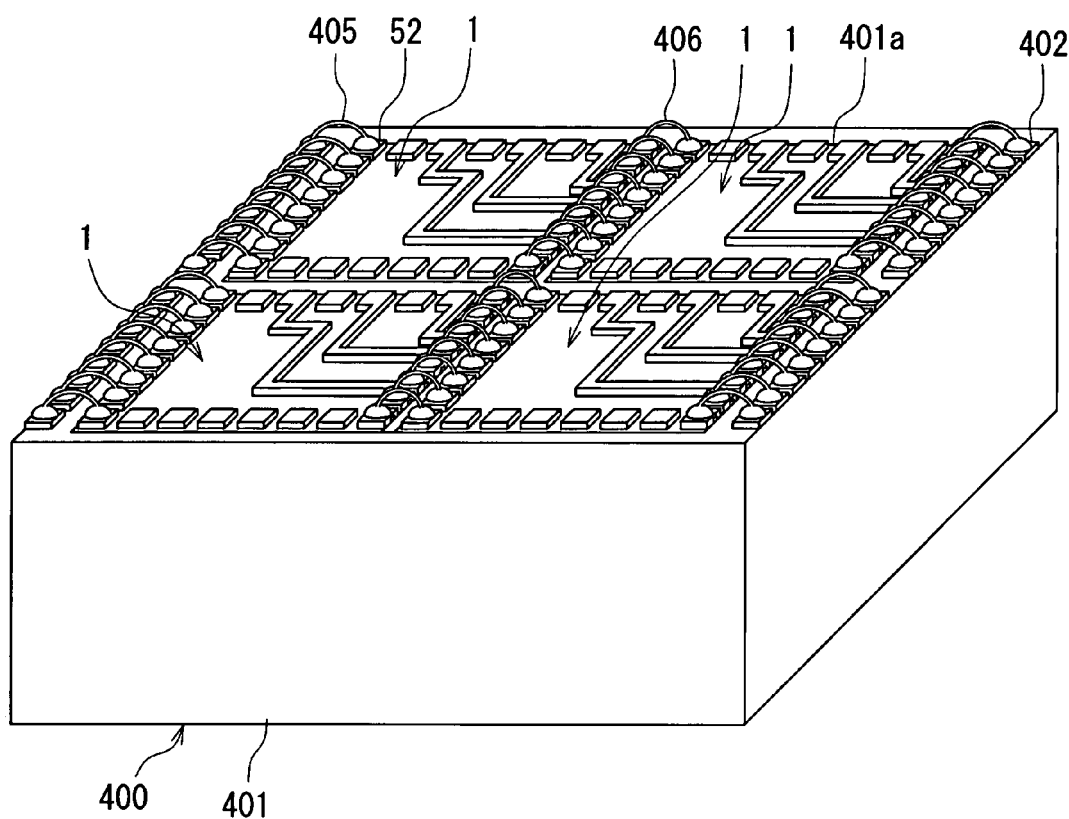
FIG. 37 is a perspective view illustrating a fourth example of use of the electronic component package of the embodiment of the invention.

FIG. 37 is a perspective view illustrating the fourth example of use of the electronic component package 1. The fourth example of use is an example in which the plurality of external connecting terminals 52 and the plurality of external connecting terminals 402 are connected to each other through a plurality of bonding wires 405 instead of the plurality of conductor layers 403 of the third example of use, and a plurality of ones of the external connecting terminals 52 of two adjacent electronic component packages 1 are connected to each other through a plurality of bonding wires 406 instead of the plurality of conductor layers 404 of the third example of use. The remainder of features of the fourth example of use are the same as those of the third example of use.

The present invention is not limited to the foregoing embodiment but can be carried out in various modifications. For example, while the wiring 3 is formed after fabricating the structure 200 by bonding a plurality of main body aggregates 160 to each other in the foregoing embodiment, the wiring 3 may be formed for each of the pre-main-body portions 2P of a single main body aggregate 160 without fabricating the structure 200.

In addition, after the main body 2 is formed by cutting the main body aggregate 160 having undergone the formation of the wiring 3, another wiring may be formed on a surface formed for the main body 2 as a result of cutting the main body aggregate 160.

In addition, the cap layer 50 having the plurality of external connecting terminals 52 may be eliminated from the main body 2 of the electronic component package 1 and part of the wiring 3 may also function as external connecting terminals.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. A method of manufacturing an electronic component package, the electronic component package comprising: a main body including first to n-th layer portions (n is an integer equal to or greater than two) that are stacked and that have their respective side surfaces, the main body having a side surface including the side surfaces of the first to n-th layer portions; and wiring disposed on the side surface of the main body, wherein each of the layer portions has at least one electronic component chip and a plurality of electrodes disposed on the side surface of the layer portion, and the wiring is connected to the electrodes of the first to n-th layer portions, the method comprising the steps of:

fabricating a pre-separation main body aggregate including a plurality of pre-separation main bodies that are to be separated from each other later so that each of them will thereby become the main body, the pre-separation main bodies being arranged in one direction that is orthogonal to the direction of stacking of the first to n-th layer portions;

forming the wiring for each of the pre-separation main bodies of the pre-separation main body aggregate; and cutting the pre-separation main body aggregate after the formation of the wiring so as to separate the plurality of pre-separation main bodies from each other so that each of them becomes the main body and a plurality of electronic component packages are thereby formed.

2. The method of manufacturing an electronic component package according to claim 1, wherein each of the layer portions further has a base including a plurality of leads, each of the leads has an end face disposed at the side surface of the layer portion to constitute one of the electrodes, and the at least one electronic component chip is bonded to the base and electrically connected to at least one of the leads.

3. The method of manufacturing an electronic component package according to claim 1, wherein the step of fabricating the pre-separation main body aggregate includes the steps of:

fabricating first to n-th substructures that respectively correspond to the first to n-th layer portions of the electronic component package, each of the first to n-th substructures including a plurality of its corresponding layer portions arranged in one plane;

cutting each of the first to n-th substructures to fabricate a plurality of elements that will be stacked to constitute the pre-separation main body aggregate later; and stacking the plurality of elements so as to form the pre-separation main body aggregate.

4. The method of manufacturing an electronic component package according to claim 3, wherein:

each of the layer portions further has a base including a plurality of leads, each of the leads has an end face disposed at the side surface of the layer portion to constitute one of the electrodes, and the at least one electronic component chip is bonded to the base and electrically connected to at least one of the leads; and the step of fabricating each of the substructures includes the steps of:

fabricating a wafer including a plurality of pre-base portions that will be separated from each other later so that each of them will thereby become the base of one of the layer portions; and bonding the at least one electronic component chip to each of the pre-base portions of the wafer.

5. The method of manufacturing an electronic component package according to claim 1, wherein the step of fabricating the pre-separation main body aggregate includes the steps of:

fabricating first to n-th substructures that respectively correspond to the first to n-th layer portions of the electronic component package, each of the first to the n-th substructures including a plurality of its corresponding layer portions arranged in one plane;

fabricating a layered substructure including a portion to become the pre-separation main body aggregate by stacking the first to n-th substructures in correspondence with the order of stacking of the first to n-th layer portions of the electronic component package; and cutting the layered substructure so as to form the pre-separation main body aggregate.

6. The method of manufacturing an electronic component package according to claim 5, wherein:

each of the layer portions further has a base including a plurality of leads, each of the leads has an end face disposed at the side surface of the layer portion to constitute one of the electrodes, and the at least one electronic component chip is bonded to the base and electrically connected to at least one of the leads; and the step of fabricating each of the substructures includes the steps of:

fabricating a wafer including a plurality of pre-base portions that will be separated from each other later so that each of them will thereby become the base of one of the layer portions; and bonding the at least one electronic component chip to each of the pre-base portions of the wafer.

7. The method of manufacturing an electronic component package according to claim 1, wherein the main body further includes a cap layer located at one end in the direction of stacking of the first to n-th layer portions.

8. The method of manufacturing an electronic component package according to claim 7, wherein the cap layer has a plurality of terminals, and the wiring is connected to at least one of the terminals.

9. The method of manufacturing an electronic component package according to claim 1, wherein the wiring is formed by plating.

10. The method of manufacturing an electronic component package according to claim 1, wherein, in each of the layer portions, the at least one electronic component chip is sealed.

11. The method of manufacturing an electronic component package according to claim 1, wherein, in the step of forming the wiring, the wiring is formed after polishing a surface of the pre-separation main body aggregate on which the wiring is to be formed.

12. The method of manufacturing an electronic component package according to claim 1, wherein, in the step of forming the wiring, a plurality of pre-separation main body aggregates are arranged in the direction of stacking of the first to n-th layer portions and are bonded to each other to fabricate a structure, the wiring is formed for each of the pre-separation main bodies of the plurality of pre-separation main body aggregates included in the structure, and then the plurality of pre-separation main body aggregates included in the structure are separated from each other.

* * * * *